US00RE41232E

(19) United States
(12) Reissued Patent
Hazelton et al.

(10) Patent Number: US RE41,232 E
(45) Date of Reissued Patent: Apr. 20, 2010

(54) WAFER POSITIONER WITH PLANAR MOTOR AND MAG-LEV FINE STAGE

(75) Inventors: Andrew J. Hazelton, Tokyo (JP); W. Thomas Novak, Hillsborough, CA (US); Akimitsu Ebihara, Sennangun Osaka (JP)

(73) Assignee: Nikon Corporation, Tokyo (JP)

(21) Appl. No.: 10/876,201

(22) Filed: Jun. 24, 2004

Related U.S. Patent Documents

Reissue of:

(64) Patent No.: 6,437,463
Issued: Aug. 20, 2002
Appl. No.: 09/556,353
Filed: Apr. 24, 2000

(51) Int. Cl.

| | |
|---|---|
| ***H01L 21/68*** | (2006.01) |
| ***G03F 9/00*** | (2006.01) |
| ***G03B 27/42*** | (2006.01) |
| ***H02K 41/00*** | (2006.01) |
| ***G05B 11/16*** | (2006.01) |

(52) U.S. Cl. ..... 310/12; 355/53; 318/593; 250/492.1

(58) Field of Classification Search ..... 318/592–593; 250/491.1, 491.2, 492.22; 355/53, 72; 310/12
See application file for complete search history.

(56) References Cited

U.S. PATENT DOCUMENTS

| | | | | |
|---|---|---|---|---|
| RE27,289 E | | 2/1972 | Sawyer | 318/38 |
| RE27,436 E | | 7/1972 | Sawyer | 346/29 |
| 3,851,196 A | | 11/1974 | Hinds | 310/12 |
| 3,935,486 A | | 1/1976 | Nagashima | 310/12 |
| 4,244,413 A | | 1/1981 | Takahashi et al. | 152/323 |
| 4,506,205 A | | 3/1985 | Trost et al. | 318/653 |
| 4,516,254 A | * | 5/1985 | Komeyama et al. | 378/34 |
| 4,535,278 A | | 8/1985 | Asakawa | 318/687 |

(Continued)

FOREIGN PATENT DOCUMENTS

| | | |
|---|---|---|
| GB | 1424413 | 2/1976 |
| JP | 7-131966 A | 5/1955 |
| JP | 62-100161 A | 5/1987 |
| JP | 2-168846 A | 6/1990 |
| JP | 3-178747 A | 8/1991 |
| JP | 4-125055 A | 4/1992 |
| JP | 7-060581 A | 3/1995 |
| WO | PCT-00/10831 | 4/2000 |

OTHER PUBLICATIONS

"Six Degree of Freedom MagLev Photolithography Stage." http://web.mit.edu./pmc/www/Projects/PhotoLith/photolith.html. Apr. 11, 2003.

"Magnetically Levitated Wafer Stepper for Photolithography." Past Projects in the MIT Precision Motion Control Laboratory. *Precision Motion Control Laboratory.* http://w3.mit.edu/pmc/www/Projects/. Apr. 11, 2003.

*Primary Examiner*—Burton Mullins
(74) *Attorney, Agent, or Firm*—Roeder & Broder LLP

(57) ABSTRACT

A positioning stage assembly having a coarse stage which includes a planar motor driveable in at least two degrees of freedom, and a fine stage positioned on the coarse stage which is driveable in at least three degrees of freedom with respect to the coarse stage. More preferably, the fine stage is driveable in six degrees of freedom and includes variable reluctance actuators for positioning in three degrees of freedom.

61 Claims, 9 Drawing Sheets

U.S. PATENT DOCUMENTS

| | | | | | |
|---|---|---|---|---|---|
| 4,555,650 | A | | 11/1985 | Asakawa | 318/135 |
| 4,560,880 | A | * | 12/1985 | Petric et al. | 250/441.11 |
| 4,654,571 | A | * | 3/1987 | Hinds | 318/687 |
| 4,694,477 | A | | 9/1987 | Siddall | 378/34 |
| 4,870,668 | A | | 9/1989 | Frankel et al. | 378/34 |
| 4,891,526 | A | | 1/1990 | Reeds | 250/442.11 |
| 4,952,858 | A | | 8/1990 | Galburt | 33/1 M |
| 4,958,115 | A | | 9/1990 | Miller | 318/662 |
| 5,157,296 | A | | 10/1992 | Trumper | 310/90.5 |
| 5,196,745 | A | | 3/1993 | Trumper | 310/12 |
| 5,294,854 | A | * | 3/1994 | Trumper | 310/90.5 |
| 5,334,892 | A | | 8/1994 | Chitayat | 310/12 |
| 5,537,186 | A | * | 7/1996 | Korenaga et al. | 355/53 |
| 5,699,621 | A | * | 12/1997 | Trumper et al. | 33/1 M |
| 5,898,477 | A | * | 4/1999 | Yoshimura et al. | 355/53 |
| 5,969,441 | A | * | 10/1999 | Loopstra et al. | 310/12 |
| 6,069,418 | A | | 5/2000 | Tanaka | 310/12 |
| 6,072,251 | A | * | 6/2000 | Markle | 310/12 |
| 6,089,525 | A | | 7/2000 | Williams | 248/550 |
| 6,097,114 | A | | 8/2000 | Hazelton | 310/12 |
| 6,144,119 | A | | 11/2000 | Hazelton | 310/12 |
| 6,151,100 | A | | 11/2000 | Yamane et al. | 355/53 |
| 6,208,045 | B1 | | 3/2001 | Hazelton et al. | 310/12 |
| 6,316,849 | B1 | * | 11/2001 | Konkola et al. | 310/12 |
| 6,353,271 | B1 | * | 3/2002 | Williams | 310/12 |
| 6,486,941 | B1 | | 11/2002 | Hazelton et al. | 355/72 |

* cited by examiner

WAFER POSITIONER WITH PLANAR MOTOR AND MAG-LEV FINE STAGE

Matter enclosed in heavy brackets [ ] appears in the original patent but forms no part of this reissue specification; matter printed in italics indicates the additions made by reissue.

FIELD OF THE INVENTION

This invention relates to alignment and isolation apparatus and methods for use particularly in microlithography, among other applications. More particularly, this invention is directed to an apparatus with at least a two dimensional motor for coarse stage positioning, in addition to efficient support of a stage for fine alignment in at least three degrees of freedom.

BACKGROUND

The need for precise positioning of an object is required in many fields of application, including applications in semiconductor manufacturing such as microlithography. As microprocessors become faster and more powerful, an ever increasing number of transistors are required to be positioned on a semiconductor chip. This necessitates closer placement of the transistors and circuits interconnecting them, which in turn requires an ever increasing accuracy in the methods for laying down the circuits on the chip. Thus, there is a need for more precise positioning and maintaining of position, of a substrate during microlithography.

Various systems have been designed to attempt to improve fine positioning and movement control of a work piece. British Patent Specification 1,424,413, assigned to Handotai Kenkyo Shinkokai describes several stage that are supported by flexures and actuated using electromagnetic force actuators. U.S. Pat. No. 3,935,486, invented by Nagashima describes a stage that is controlled using electromagnetic force actuators. In this case, the stage is supported on flexural bearings in 6 degrees of freedom (DOF) and the actuators are used to adjust the position of the stage. Both of these designs utilize flexural bearings to constrain the motion of the stages in 6 DOF. The electromagnetic actuators only provide force; they are not used to control all directions of motion of the stage. Nor is there any disclosure of providing a linear motor driven coarse stage.

Ideally, the bearings for a stage should have infinite stiffness in the directions for which position of the stage is to remain fixed, and zero stiffness along the directions in which the stage is to be moved, to maximum precision and efficiency. Flexural bearings fall far short for the ideal and generally have a stiffness ratio (stiffness in directions to be fixed to stiffness in directions to be moved) of only about 100:1 and possibly up to about 1000:1 but the price of the latter is likely prohibitive in practice. Moreover, a much greater stiffness ratio is desirable.

U.S. Pat. No. 4,952,858 invented by Galburt describes a wafer fine stage that is supported and positioned in 6 DOF by electromagnetic voice coil motors. The motion of the wafer fine stage is entirely constrained using voice coil motors, and this design does not utilize any flexural bearings. Voice coil motors, however, require relatively large amounts of power to generate a given amount of force. The high power requirements of voice coil motors can generate sufficient heat to change the index of refraction of the environment sufficiently to induce error in an interferometer system. Additionally, heat generation can cause expansion of the stage leading to further errors in alignment and control. Further, U.S. Pat. No. 4,952,858 discloses the use of permanent magnets to counterbalance the weight of the fine stage.

This counterbalance force is a nonlinear function of stage position, and is thus quite difficult to control accurately.

U.S. Pat. Nos. 5,157,296 and 5,294,854, invented by Trumper describe a wafer fine stage bearing system. This system includes electromagnetic actuators, which act as bearings in 6 DOF. These patents describe control means for the bearings and apparatus for counterbalancing the weight of the stage using either opposed permanent magnets or a heavy oil in which the stage floats. U.S. Pat. Nos. 5,157,296 and 5,294,854 also do not utilize flexural bearings. The electromagnetic actuators in the Trumper patents are arranged in pairs, on opposite sides of the stage, in order to provide stable control. Thus, all forces applied by the electromagnetic pairs are transmitted through the stage, which can result in deformation of the stage.

The counterbalance forces in the Trumper patents may be provided by permanent magnets or by floating the stage in oil. As noted above with regard to the Galburt patent, utilization of permanent magnets results in a nonlinear force curve and corresponding control problems. With regard to floating the stage in oil, oil presents significant problems for a clean room environment typically used for semiconductor processing.

U.S. Pat. No. 5,528,118, invented by Lee, describes a guideless stage for aligning a wafer in a microlithography system, and a reaction frame which isolates both external vibrations as well as vibrations caused by reaction forces from an object stage.

U.S. Pat. No. 5,623,853, invented by Novak, et al., describes a wafer coarse and fine stage for a lithography machine. The coarse stage is a stacked arrangement of linear motor-driven air bearing slides. The fine stage is driven in 3 DOF using voice coil motors. The remaining DOF of the fine stage are constrained using flexural bearings. The use of flexural bearings for the 3 planar DOF limits the servo bandwidth of the stage because the flexural bearings have a limited stiffness in the plane. In addition, the finite stiffness of the flexural bearings out of the plane, distorts the out of plane motion of the stage.

In addition to the above described attempts at providing a superior fine stage design, various attempts have also been made to provide planar motors for use in driving positioners in the field. Disclosures in the field of planar motors include Hinds, U.S. Pat. No. 3 51,196; Hinds, U.S. Pat. No. 4,654,571; Trumper, U.S. Pat. No. 5,196,745; and Chitayat, U.S. Pat. No. 5,334,892. These patents describe planar motors that have significant limitations. For example, the planar motors of Hinds '196 has limited range of motion because each portion of the stationary magnet array can only generate force in a single direction. Thus, each coil array must always be located above the corresponding magnet array. This limits the range of movement for a given size actuator. In addition, the coils and magnets are iron-core and generate sizable attractive forces as well as force ripple. This does not allow for motion in six degrees of freedom because the levitation force cannot overcome the attractive force between the two pieces. Additionally, none of these attempts have combined, or suggested to combine a fine stage operating in conjunction with a planar motor coarse stage.

Hinds '571 suffers from a non-compact design. A large portion of the base of the moving portion of the stage is covered by the air bearing pads and other elements. Only a small portion of the stage is covered with coils. In addition, the coil design is not the most efficient for producing force, since at most only fifty per cent of the coil can generate force. In addition, the moving coil design has a large number of hoses and cables going to the stage, creating a large bias force. Finally, this design does not generate force for a six-degree-of-freedom movement.

Trumper discloses several stage designs with six degrees of freedom. The invention uses conventional coils. Each coil array must be located above a corresponding linear magnet array. This restricts the range of movement for a given sized stage.

Chitayat discloses several planar motor designs, which permit a wide range of motion, but only restricted to translation and rotation in a plane. Thus, the motor of Chitayat is incapable of moving with six degrees of freedom.

Kim and Trumper, in "High-Precision Magnetic Levitation Stage for Photolithography", American Society for Precision Engineering, 1997 Proceedings, Volume 16, pp. 470–473, discloses the design of a permanent magnet linear motor, for use in a magnetically-levitated wafer stepper stage in which four linear motors provide both suspension and drive forces.

Holmes et al., in "A Long Range Scanning Stage", American Society for Precision Engineering, 1997 Proceedings, Volume 16, pp. 474–477, discloses a long range scanning stage, having 25 mm×25 mm mobility in the X-Y plane and Kim and Trumper, in "Precision Control of Planar Magnetic Levitator", American Society for Precision Engineering, 1998 Proceedings, Volume 18, pp. 606–609, discloses a stage that provides fine motion control in six degrees of freedom. The key element is a linear motor capable of providing suspension and translation forces without contact.

Asakawa, U.S. Pat. No. 4,555,650, discloses a two-dimensional driving device for use in a positioning device for a semiconductor manufacturing apparatus. A magnetic field group is formed by disposing magnetic fields on a plane in a two-dimensional array. At least two coils are distinctly oriented so as to provide a driving force in each of two orthogonal directions. Asakawa, U.S. Pat. No. 4,535,278 also provides a two dimensional driving arrangement for "precision" positioning through use of a planar array of magnetic fields that interact with appropriately oriented coils. Since the devices disclosed in these patents are not capable of positioning in greater than two degrees of freedom, there is a need to provide a finer control in a portioning device.

Sawyer, U.S. Reissued Pat. No. Re. 27,289 discloses a magnetic system for moving a marking tool over a surface for plotting curves. Sawyer, Reissue Pat. No. Re. 27,436 discloses a two-axis magnetic system for driving chart plotters. The Sawyer Reissue patents are not only not directed to the semiconductor-positioning field, but they also are limited to positioning along only two degrees of freedom. Additionally, they use variable reluctance to drive the devices and consequently have cogging forces and relatively low precision.

Trost et al., U.S. Pat. No. 4,506,205 discloses an electromagnetic alignment apparatus for use in aligning wafers in a microlithography system. The apparatus includes three or more spaced magnets that are fixed and interact with three or more spaced coil assemblies that move to effect positioning. As a result, the structure can be moved selectively in three degrees of freedom.

Siddall, U.S. Pat. No. 4,694,477, discloses an apparatus for micro positioning an X-ray lithography mask, in which three piezoelectric transducers are provided for moving a stage plate in the X-Y plane, and three flexure assemblies support the stage plate and move the stage plate along the Z-axis. As noted above, the use of flexural bearings limits the servo bandwidth of the stage because the flexural bearings have a limited stiffness in the plane. In addition, the finite stiffness of the flexural bearings out of the plane, distorts the out of plane motion of the stage.

Reeds, U.S. Pat. No. 4,891,526 discloses a positioning stage for high speed step and repeat alignment of a semiconductor wafer to a mask with six degrees of freedom. Linear bearings are provided on a first plate for movement in the X-direction, and this sub stage is also mounted on an intermediate stage that is mounted on another set of linear bearings for movement in the Y direction. The entire X-Y stage is then mounted on a rotation stage platform.

What is needed that is not provided in the prior art is an improved stage positioner in which higher fine stage mechanical bandwidth is obtained by improving the stiffness characteristics of the bearings/drivers supporting the fine stage. A related advantage to be obtained thereby is the elimination of cross coupling between X or Y axis acceleration forces and Z axis motion. In several embodiments, an advantage is obtained in the ability to control the fine stage through feed-forward actuation of the bearings supporting the fine stage. Another need is to reduce the complexity and improve the performance of a coarse stage on which the fine stage is mounted. A planar motor can provide motion and force in at least two directions, thereby eliminating the need for a set of stacked X-Y stages. This reduces the mechanical complexity and mass of the coarse stage, and increases the stiffness by removing joints between the stacked stages, all of which results in improved dynamic performance of the apparatus.

DISCLOSURE OF THE INVENTION

In accordance with the present invention, a positioning stage assembly is provided which has a coarse stage including a planar motor driveable in at least two degrees of freedom. A fine stage is positioned on the coarse stage and is driveable in at least three degrees of freedom with respect to the coarse stage, preferably, in six degrees of freedom.

At least one pair of electromagnetic actuators may couple the fine stage to the coarse stage for control in at least one of the degrees of freedom with respect to the coarse stage. In at least one embodiment, both actuators of the pair are mounted adjacent a single side of the fine stage. Both actuators of the pair may be mounted on the coarse stage in close opposition to one another; and a pair of corresponding targets may be mounted on the fine stage adjacent one another and within a predefined gap defined by the mounted electromagnetic actuators. Preferably, the pair of corresponding targets are peripherally mounted on the fine stage.

Three pairs of electromagnetic actuators may be provided to couple the fine stage to the coarse stage for control in three degrees of freedom with respect to the coarse stage. Two of the three pairs may be aligned substantially parallel to a first direction, and a third of the three pairs of electromagnetic actuators may be aligned in a second direction substantially perpendicular to the first direction. Preferably, the first and second directions are within a plane that the fine stage substantially lies in.

The electromagnetic actuators may comprise variable reluctance actuators. Three additional electromagnetic actuators may be mounted between the fine stage and the coarse stage for control of the fine stage in three additional degrees of freedom. The additional electromagnetic actuators may comprise voice coil motors (VCMs). Still further, supplemental vertical supports, preferably air bellows, may be mounted between the fine stage and the coarse stage. Other forms of non-contact vertical support members may also levitate the fine stage above the coarse stage. One advantageous arrangement includes three non-contact vertical support members for controlling the position of said fine stage in three vertical degrees of freedom. Various electromagnetic actuators other than VCMs may be employed.

Additionally, a positioning stage is provided which includes first and second fine stages positioned on first and second coarse stages and driveable in at least three degrees of freedom with respect to the respective coarse stage and independently of each other.

A planar motor for use in the present invention is preferably driveable in at least three degrees of freedom and may be driveable in six degrees of freedom. The planar motor includes a planar magnet array having magnets disposed in a plane, the magnets having independent magnetic fields. A planar coil array is positioned adjacent to the planar magnet array, such that one of the magnet array and the coil array is fixed and the other is movable with respect thereto.

In the positioning stage assembly, the magnet array may be fixed, with the coil array movable with respect to the magnet array. In this example, the coil array is fixed or mounted to the fine stage, so that movement of the coil array causes coarse positioning of the fine stage.

Alternatively, the coil array may be fixed, with the magnet array being movable with respect to the coil array. In this example, the magnet array is fixed or mounted to the fine stage, so that movement of the magnet array causes coarse positioning of the fine stage.

A lithography system is disclosed which includes a frame; an illumination system mounted on the frame; a coarse stage mounted on the frame and including a planar motor driveable in at least two degrees of freedom; and a fine stage mounted to the coarse stage and driveable in at least three degrees of freedom with respect to the coarse stage. Preferably, the fine stage is driveable in six degrees of freedom with respect to the coarse stage.

At least one pair of electromagnetic actuators may couple the fine stage to the coarse stage for control in at least one of the degrees of freedom with respect to the coarse stage. Both actuators of the pair of electromagnetic actuators may be mounted adjacent a single side of the fine stage. Both actuators of the pair may be mounted on the coarse stage in close opposition to one another, and a pair of corresponding targets may be mounted on the fine stage adjacent one another and within a predefined gap defined by the mounted electromagnetic actuators.

The lithography system further comprises a mask pattern positioned between the illumination system and fine stage, and a lens system positioned between the mask pattern and the fine stage.

Three pairs of electromagnetic actuators may be provided to couple the fine stage to the coarse stage for control in three degrees of freedom with respect to the coarse stage. Preferably, two of the three pairs of electromagnetic actuators are aligned substantially parallel to a first direction, and a third of the three pairs is aligned in a second direction substantially perpendicular to the first direction. Preferably, the first and second directions are within a plane that the fine stage substantially lies in. Preferably, the electromagnetic actuators may comprise variable reluctance actuators.

Three additional electromagnetic actuators may be mounted between the fine stage and the coarse stage for control of the fine stage in three additional degrees of freedom. The additional electromagnetic actuators may comprise VCMs. Further, supplemental vertical supports may be mounted between the fine stage and the coarse stage.

A method of precisely positioning a stage is disclosed to include: coarse positioning the stage in at least two degrees of freedom, wherein the coarse positioning is driven by a planar motor; and fine positioning the stage in at least three degrees of freedom with respect to the coarse positioning. Preferably, the coarse positioning comprises positioning in at least three degrees of freedom. The coarse positioning may comprise positioning in six degrees of freedom.

The fine positioning preferably includes positioning in six degrees of freedom with respect to the coarse positioning. Opposing forces may be inputted for moving the stage in opposite directions at the same location on the stage, such that a pulling force for moving the stage in a first direction is inputted at the same side of the stage as a pushing force for moving the stage in a second direction opposite to the first direction. Preferably the forces are inputted as magnetic driving forces with no physical contact of the stage by a driver.

Three input locations may be arranged on the fine stage, such that a pulling force for moving the fine stage in a first direction at each location is inputted at the same side of the fine stage as a pushing force for moving the fine stage in a second direction opposite to the first direction. Preferably, the fine stage is floated with respect to the coarse stage base such that positioning movements of the fine stage are performed with no physical contact occurring between the fine stage and the coarse stage base. The floating is preferably accomplished by electromagnetically biasing the fine stage with respect to the coarse stage base.

The fine positioning preferably comprises actuating controlling movements in at least three degrees of freedom with variable reluctance actuators. Fine controlling of the stage in three additional degrees of freedom may be performed with VCMs.

Further, a method of precisely positioning two stages includes coarse positioning two stages independently of one another, each in at least two degrees of freedom, wherein the coarse positioning is driven by a planar motor; and fine positioning the two stages independently of one another, each in at least three degrees of freedom with respect to the coarse positioning. Preferably, the coarse positioning includes positioning in at least three degrees of freedom, and may include positioning in six degrees of freedom. Preferably, the fine positioning comprises positioning in six degrees of freedom with respect to said coarse positioning.

These and other features are more fully described in the detailed examples that follow.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where an element is the same in different drawings, in which.

BEST MODE FOR CARRYING OUT THE INVENTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense as it is understood that the present invention is in no way limited to the embodiments illustrated.

Figure 1:
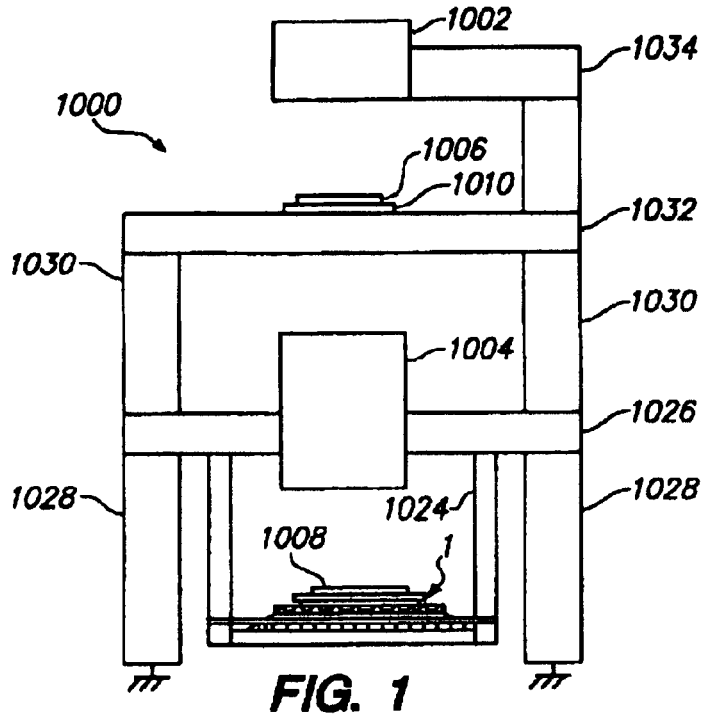
FIG. 1 is a schematic view illustrating a photolithographic instrument incorporating a wafer positioning system in accordance with the present invention.

A brief description of a photolithography instrument will be given here as background for a preferred use of the positioning stage system according to the present invention. FIG. 1 is a schematic view illustrating a photolithographic instrument 1000 incorporating a wafer positioning stage system 1 driven in at least two degrees of freedom by a coarse stage incorporating a planar motor and being further controlled by a fine stage mounted to the coarse stage and positionable in at least three degrees of freedom. Photolithographic instrument 1000 generally comprises an illumination system 1002 which projects radiant energy (e.g. light) through a mask pattern (e.g., a circuit pattern for a semi-conductor device) on a reticle 1006 that is supported by and scanned using a stage 1010. Reticle stage 1010 is supported by a frame 1032. The radiant energy is focused through a system of lenses 1004 supported on a frame 1026, which is in turn anchored to the ground through a support 1028. Lens system 1004 is also connected to illumination system 1002 through frames 1026, 1030, 1032, and 1034. The radiant energy exposes the mask pattern onto a layer of photoresist on a wafer 1008.

Figure 2:
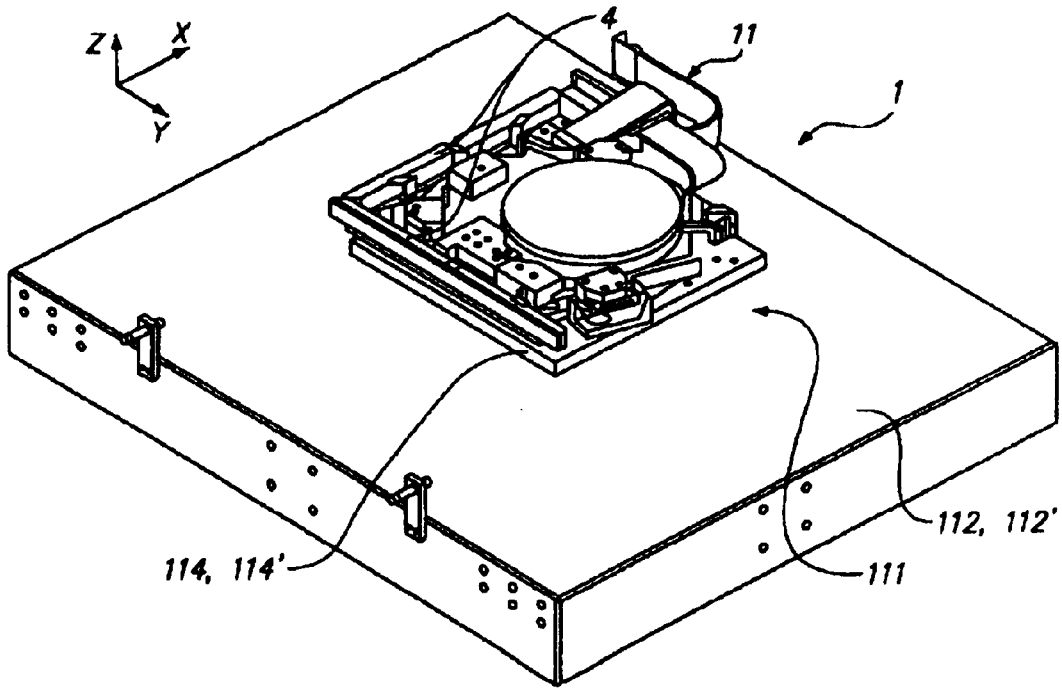
FIG. 2 is a perspective view of a stage system according to a preferred embodiment of the present invention.
Figure 10:
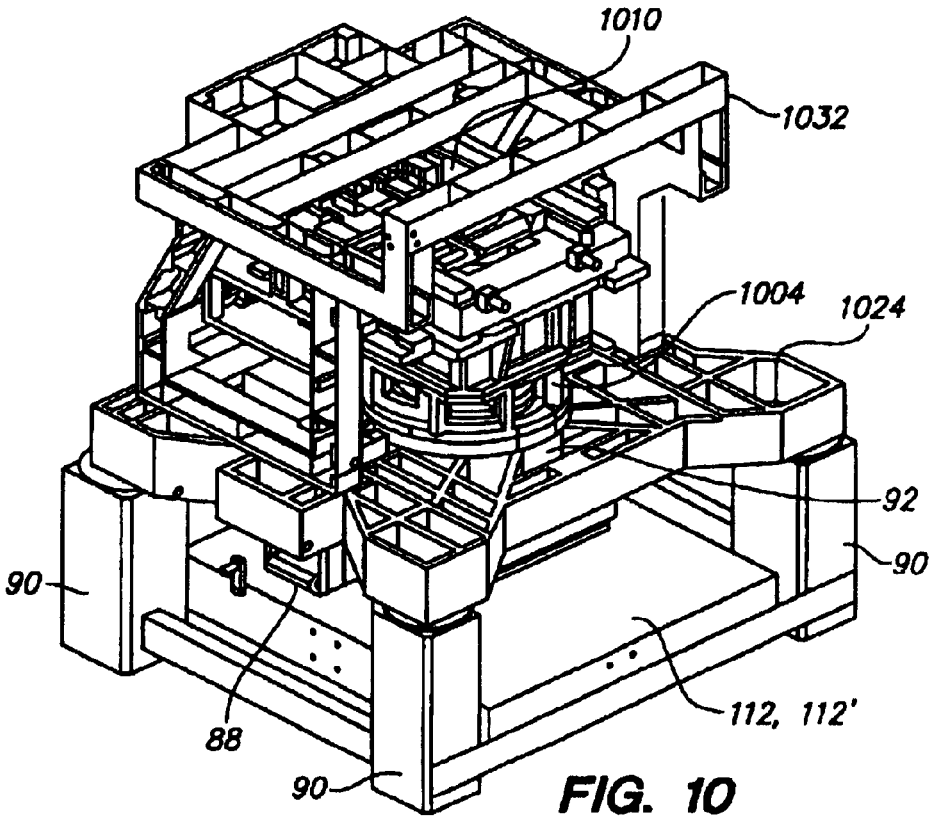
FIG. 10 is a perspective view of a lithography system according to the present invention.

Wafer 1008 is supported by and scanned using the wafer positioning stage system 1. The fine stage 11 is limited in travel to about 400 microns total stroke in each of the X and Y directions. The fine stage 11 is in turn supported by a lower or coarse stage 111 (FIGS. 2, 10). The lower stage 111 has a much longer stroke and is used for coarse positioning, stage 11 which is coarsely positionable by a lower stage 111 that incorporates a planar motor having a planar base 112, 112' upon which translates a movable portion 114,114' of the planar motor. The fine stage 11 is mounted to an arrangement of coils 114 when the fine stage 11 translates over a magnetic array in the planar base 112 of the lower stage 111. Alternatively, the fine stage 1 is mounted to an arrangement of magnets 114' when the fine stage 11 translates over a coil array in the planar base 112' of the lower stage 111.

The fine stage 11 interfaces the lower stage 111 through the movable portion 114,114' of the planar motor (FIG. 2), for small and precise movements in the X, Y and Theta Z (rotation in the X-Y plane) directions. The fine stage 11 includes a wafer chuck 2 (FIG. 3) on which a wafer can be mounted for precise positioning. Mirrors 4 are mounted on the fine stage 11 and aligned with the X and Y axes. The mirrors 4 provide reflective reference surfaces off of which laser light is reflected to determine a precise X-Y position of the fine stage 11 using a laser interferometer system (not shown).

The position of the fine stage in three planar degrees of freedom, X, Y, and Theta Z, is actuated using three pairs of electromagnets 6 that are mounted to the lower stage 111 (i.e., the movable portion 114,114' of the planar motor). The electromagnets 6 are preferably formed as E-shaped laminated cores made of silicon steel or preferably Ni—Fe steel, that each have an electrical wire winding around the center section. Electromagnetic targets 8, preferably each in the form of an I-shaped piece of magnetic material, and preferably made up of the same material or materials used to make the corresponding E-shaped laminated cores, are placed oppositely each of the electromagnets 6, respectively. Each electromagnet 6 and target 8 is separated by an air gap g (which is very small and therefore difficult to see in the figures). The electromagnets 6 are variable reluctance actuators and the reluctance varies with the distance defined by the gap g, which, of course also varies the flux and force applied to the target 8. The attractive force between the electromagnet and the target is defined by:

$$F=K(i/g)^2$$

where F is the attractive force, measured in Newtons;

K=an electromagnetic constant which is dependent upon the geometries of the "E-shaped" electromagnet 6, "I-shaped" target 8 and number of coil turns about the magnet. $K=\frac{1}{2}N^2\mu_o wd$; where N=the number of turns about the E-shaped magnet core 8; $\mu_v$=a physical constant of about $1.26\times10^{-6}$ H/m; w=the half width of the center of the E-shaped core 8, in meters; and d=the depth of the center of the E-shaped core 8, in meters. In a preferred embodiment, $K=7.73\times10^{-6}$ kg $m^3/s^2A^2$;

i=current, measured in amperes; and g=the gap distance, measured in meters.

When the coil of an electromagnet is energized, the electromagnet 6 generates a flux which produces an attractive force on the target 8 in accordance with the formula given above, thereby functioning as a linear actuator. Because the electromagnets 6 can only attract the targets 8, they must be assembled in pairs that can pull in opposition. The targets 8 are fixed to the fine stage 11 that is movable relative to the lower stage 111. Opposing pairs of electromagnets 6 are fixed on the relatively non-moveable (with respect to controlling movements of the fine stage 11) lower stage portion (moveable portion of the planar motor) 114, 114' on opposite sides of the targets 8. Thus, by making a current through one coil of the pair to be larger than the current through the other coil in the pair, a differential force can be produced to draw the targets in one direction or its opposing direction.

The electromagnets' targets 8 are attached to the fine stage 11 in such a way that the pulling forces of the opposing pair of electromagnets 6 do not distort the fine stage 11. This is preferably accomplished by mounting the targets 8 for an opposing pair of electromagnets 6 very close to one another, preferably peripherally of the fine stage 11. A thin web of material 9, which is preferably made of the same material that the fine stage is made of, preferably ceramic, such as silicon carbide or alumina, for example, may extend from the periphery of the fine stage, to provide a mounting site for each of the respective targets 8. A further illustration of the web is shown in a commonly owned, co pending application entitled "Wafer Stage With Magnetic Bearings", which was filed on even date herewith and which bears Attorney Docket No. 371922002600. The application entitled "Wafer Stage With Magnetic Bearings" and bearing Attorney Docket No. 371922002600 is incorporated herein in its entirety by reference thereto. The opposing electromagnets 6 are mounted on the lower stage 111 by a predetermined distance so that when the web 9 and targets 8 are positioned there between, a predetermined gap g is formed between each set of electromagnet 6 and target 8. With this arrangement, only the resultant force, derived from the sum of the forces produced by the pair of electromagnets 6 and targets 8, is applied to the fine stage 11 via transfer of the force through the web 9. In this way, opposing forces are not applied to opposite sides of the stage and stage distortion problems resulting from that type of arrangement are avoided.

Figure 3:
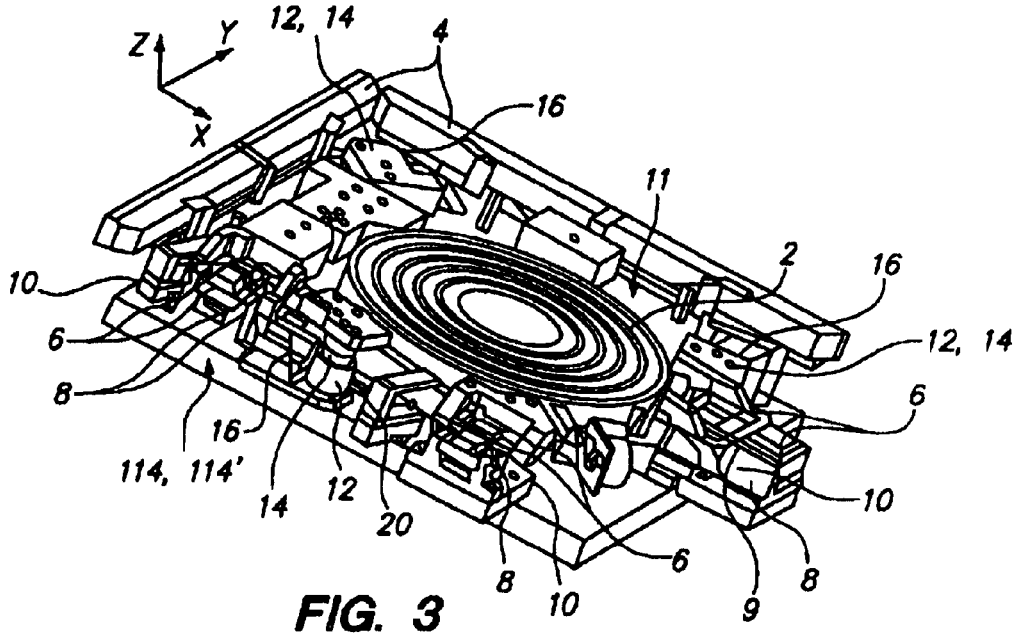
FIG. 3 is a perspective view of the fine stage of the embodiment shown in FIG. 2.

FIG. 3 shows a preferred arrangement of the electromagnets 6 and targets 8 in which one opposing pair is mounted so that the attractive forces produced thereby are substantially parallel with the X direction of the stage. Two opposing pairs are mounted so that attractive forces from each pair are produced substantially parallel with the Y direction of the stage. With this arrangement, control of three degrees of freedom of the fine stage 11 can be accomplished, namely fine movements in the X, Y and theta Z directions. Of course, two opposing pairs could be mounted parallel with the X direction and one pair parallel with the Y direction, to work equally as well as the shown preferred arrangement. Other arrangements are also possible, but the preferred arrangement minimizes the number of actuators/bearings required for the necessary degrees of control.

Typically, the lines of force of the actuators are arranged to act through the center of gravity (CG) of the stage. The two Y actuators are typically equidistant from the CG.

Actuation of the single pair of electromagnets 6 can achieve fine movements in either X direction. Actuation of the two pairs of electromagnets aligned along the Y axis can control fine movements of the fine stage 11 in either Y direction, or in rotation (clockwise or counterclockwise) in the X-Y plane (i.e., theta Z control). Y axis movements are accomplished by resultant forces from both pairs which are substantially equal and in the same direction. Theta Z movements are generally accomplished by producing opposite directional forces from the two pairs of electromagnets, although unequal forces in the same direction will also cause some theta Z adjustment.

Three short range sensors 10 measure the distance between the fine stage 11 and the lower stage portion 114, 114' in the three planar degrees of freedom. The fine stage 11 is also levitated in the three vertical degrees of freedom, Z, Theta X and Theta Y. Because control in the three vertical degrees of freedom requires less dynamic performance (e.g., acceleration requirements are relatively low) and is easier to accomplish, lower force requirements exist than in the previously described X, Y and Theta Z degrees of freedom. Thus, the use of three VCM (voice coil motor) magnets 12 attached to the lower stage portion 114,114' and three VCM coils 14 attached to the fine stage 11 are satisfactory for the vertical levitation. The relative position in the three vertical degrees of freedom is measured using three linear sensors 16. To prevent overheating of the VCM coils 14 the dead weight of the fine stage 11 is supported by air bellows 20. Preferably, three air bellows are employed and respectively located next to the VCMs. The bellows 20 have very low stiffness in all degrees of freedom so they do not significantly interfere with the control of the fine stage 11.

While the embodiments of the fine stage 11 described above and shown in FIG. 3 are preferred to obtain the maximum bandwidth advantages, alternative arrangements, in combination with any of the planar motor lower stages described above and below, provide advantages in stiffness as described above and reduce complexity of the coarse stage while at the same time improving performance. For example, other types of fine stages which provide six degrees of freedom of control, which can be used advantageously with a planar motor driven lower stage include voice coil motor driven stages, stages which are supported by flexures and driven by electromagnetic force actuators, stages using permanent magnets and/or air bearings, and combinations of the foregoing. Even stages which provide only three degrees of freedom of control can provide some advantage when combined with a lower stage according to the present invention.

Figure 4:
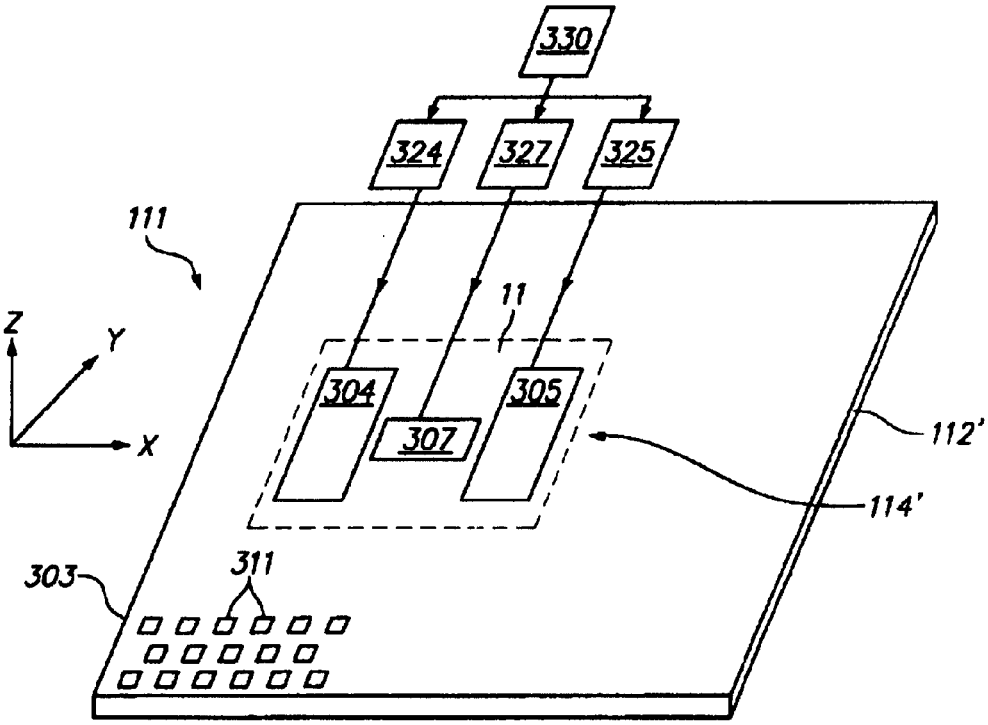
FIG. 4 is an isometric view schematically showing an example of a moving coil planar motor arrangement of the present invention.

FIG. 4 is an isometric view schematically showing a moving coil planar motor for use in a lower stage 111 according to the present invention. The planar motor in this example includes three coils 304, 305 and 307. A flat magnet array 303 having a plurality of magnets 311 is provided on the stationary base 112'. A single X coil 307 and two Y Coils 304 and 305 are attached to the underside of the fine stage 11 and are included in the movable portion 114' of the planar motor. Fine stage 11 (drawn in dashed lines) is suspended above and parallel to magnet array 303. Y coils 304 and 305 are similar in structure to one another and have coil wires oriented to provide force substantially in a Y direction. X coil 307 and Y coils 304, 305 are similar in structure, but X coil 307 has coil wires oriented to provide force substantially in an X direction perpendicular to the Y direction.

To provide force to the fine stage 11 in the X direction relative to magnet array 303, two phase, three phase, or multiphase commutated electric current is supplied to X coil 307 in a conventional manner by a commutation circuit and current source 327. To provide force to fine stage 11 in the Y direction, two phase, three phase, or multiphase commutated electric current is supplied to either one or both of the Y coils 304 and 305 in a conventional manner by respective commutation circuits and current sources 324 and/or 325. To provide rotational torque to the frame of fine stage 11 relative to magnet array 303 in a horizontal plane parallel to the X and Y axes, commutated electric current is supplied to either of Y coils 304 or 305 individually by respective commutation circuits and current source 324 or 325. Alternatively, electric current is supplied to both Y coils 304 and 305 simultaneously but with opposite polarities by respective commutation circuits and current sources 324 and 325, providing Y force to one of Y coils 304, 305 in one direction and the other Y coil 304, 305 in an opposite direction, thereby generating a torque about an axis normal to the XY plane. This torque typically causes rotation of the frame of fine stage 11 in the XY plane.

Alternatively, in some embodiments the torque causes translation of the frame of fine stage 11, if it has a center of mass offset from its geometric center.

Commutation circuits and current sources 324, 325, and 327 are controlled by a conventional motor control module 330, providing logic signals for directing the operation of planar motor 300. Connecting leads between motor coils 304, 305, 307, and their corresponding commutation circuits and current sources 324, 325, 327 each comprise a plurality of electric wires, distributing current selectively through the individual coil phases.

Figure 5:
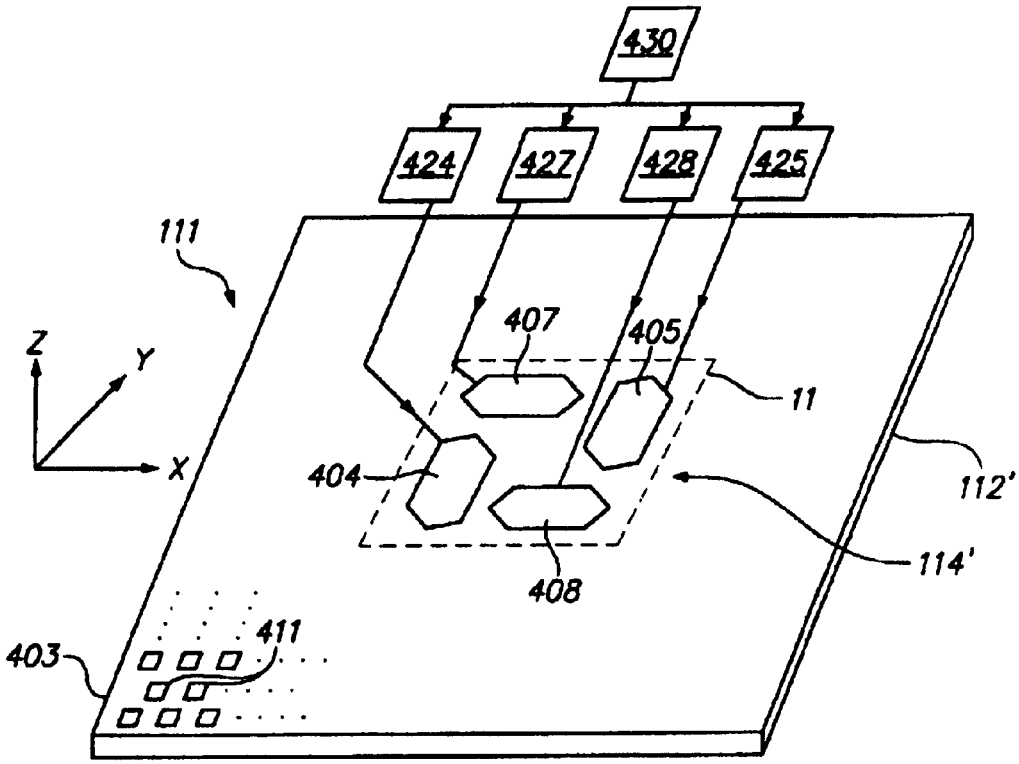
FIG. 5 is an isometric view schematically showing another example of a moving coil planar motor arrangement of the present invention.

FIG. 5 is an isometric view schematically showing another moving coil planar motor arrangement for a lower stage 111 according to the present invention, in which the moving portion 114' has four coils arranged into two sets of paired coils. A flat magnet array 403 having a plurality of magnets 411 is provided on the base 112' of the lower stage 111. Illustratively magnets 411 are configured in a checkerboard pattern, as described in detail below in connection with FIG. 6. X coils 407 and 408 and Y coils 404 and 405 are attached to the underside of a frame of a fine stage 11 (drawn in dashed lines). Coils 404, 405, 407, and 408 are similar in structure to one another and are oriented in differing directions. Y coils 404 and 405 are oriented so that their coil wires are aligned perpendicular to the Y direction. X coils 407 and 408 are oriented so that their respective wires are aligned perpendicular to the X direction.

To move the fine stage 11 in the X direction relative to magnet array 403, two phase, three phase, or multiphase commutated electric current is supplied to X coils 407 and 408 in a conventional manner by respective commutation circuits and current sources 427 and 428. To move fine stage 11 in the Y direction, two phase, three phase, or multiphase commutated electric current is passed through either one or both of Y coils 404 and 405 in a conventional manner by respective commutation circuits and current sources 424 and 425. To rotate the frame of the fine stage 11 in the horizontal XY plane, appropriately commutated electric current of the required polarity is supplied to any one or more of coils 404, 405, 407, and 408 by the corresponding commutation circuit and current source 424, 425, 427, and 428. Alternatively rotation is achieved by energizing pairs of coils 404, 405 or 407, 408 in opposition, or by appropriately energizing both sets of coil pairs 404,405, and 407,408 in opposition by their corresponding commutation circuits and current sources 425, 425, 427, 428. As described above in connection with FIG. 4, commutation circuits and current sources 425,425, 427, 428 are controlled by a conventional motor control module 430. In the planar motor embodiments as illustrated in FIGS. 4 and 5, the various coil sets can be rearranged geometrically without departing from the spirit or scope of the invention.

In some embodiments, the moving coil motors of FIGS. 4 and 5 respectively are made in an iron free implementation, in which the entire moving stage is non-magnetic. This is beneficial for reducing detect forces and preventing magnetic attraction to the magnet array, but does not provide the highest electromagnetic forces. In some embodiments, the stages of the planar motors are made with a flat sheet of iron backing the coils. Alternatively, the planar motors have coils inserted into slots in an iron backing plate. In the latter two configurations, electromagnetic force is increased, and attractive magnetic forces can be used to preload air bearings as described in the following paragraph.

Alternative embodiments to the planar motors described in FIGS. 4 and 5 are motors equipped with air bearings. For example, air bearings are installed and operated in a conventional fashion at the four corners of a fine stage 11 so that the stage floats on an air cushion above magnet array 303,403 even when the coils are not commutated for producing Z direction force. Motors using these alternative embodiments do not require commutation for generating Z direction force. However, motors of these alternative embodiments cannot produce motion in the Z direction, and thus are confined to three degrees of freedom only. Using motors of these alternative embodiments, movement in the X and Y directions and rotation in the plane defined by the X and Y axes are possible. Air bearings are well known in the art of planar motors (see for example Hinds '571, cited above, and Sawyer U.S. Pat. No. Re. 27,436 reissued Jul. 18, 1972).

Figure 6:
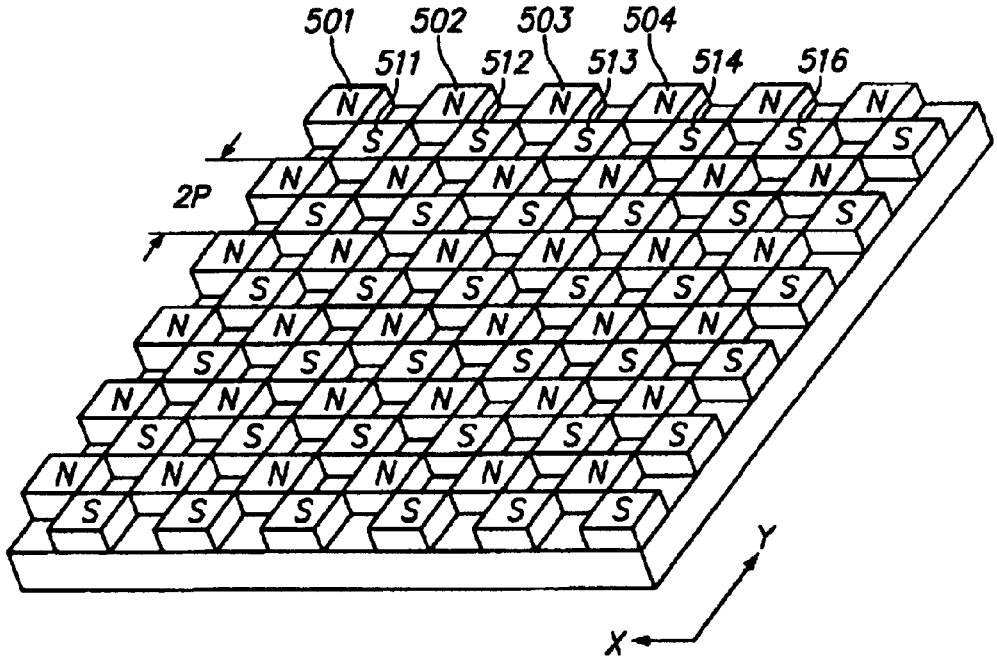
FIG. 6 is an isometric view showing an example of a magnet array configured for a moving coil planar motor according to the present invention.

FIG. 6 is an isometric view showing a magnet array configured for a planar motor, illustratively, the motors FIGS. 4 and 5. Accordingly, the magnets 311,411 may respectively be configured as described below with regard to magnets 501,502 . . . 516, etc. The magnets form rows in the X direction and columns in the Y direction as defined by X and Y coordinate arrows, and are arranged in a staggered checkerboard fashion. The polar axes of all magnets in the array are aligned parallel to the Z direction (perpendicular to the X-Y coordinate plane). The magnets within any row or column have the same polarity. For example, magnets 501–504 all have the N poles facing out ("N magnets" hereinafter), and magnets 511–516 all have S poles facing out ("S magnets" hereinafter). The magnets are all equal in size and square in cross-section, although magnets of other shapes are also possible. In some embodiments, the magnets are rectangularly shaped, while in some embodiments, the magnets may be octagonally shaped. In the X direction there as 12 rows of magnets including 6 rows of N magnets and 6 rows of S magnets. In the Y direction, there are 12 columns of magnets including 6 columns of N magnets and 6 columns of S magnets. In some embodiments, particularly those involving moving coil motors, the numbers of rows and columns in a magnetic array are substantially larger, providing for a larger desired range of travel. In some embodiments, the number of rows and the number of columns are unequal.

Magnetic pitch is the distance from the center of a "N magnet" to the center of the next adjacent "S magnet" parallel to a row or column of a magnet array. In an array of rectangularly shaped magnets, for example, an X direction magnetic pitch Px of the array is the distance between adjacent "N magnet" and "S magnet" centers parallel to the X direction. For a square array of magnets, the magnetic pitch P of the magnet array is the distance between adjacent "N magnet" and "S magnet" centers parallel to either X or Y axis. The square magnet array of FIG. 6 includes 12 rows and 12 columns of magnets, and has a pitch P such that the combined length of an adjacent "N magnet" and "S magnet" equals 2P.

Figure 7:
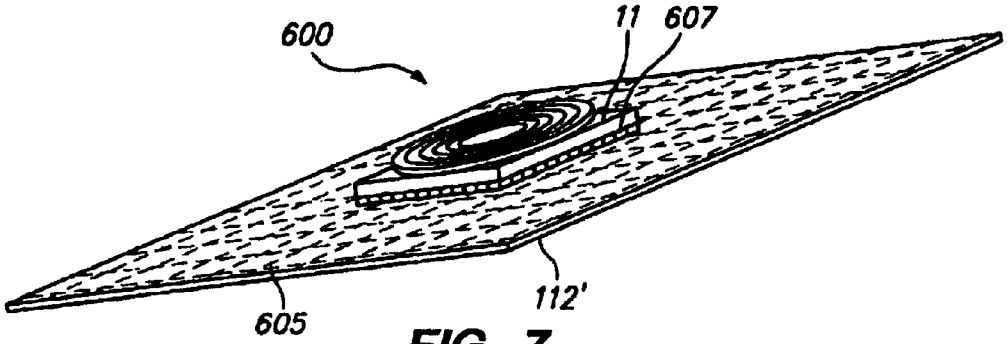
FIG. 7 is an isometric view illustrating an example of a moving magnet planar motor arrangement in accordance with the invention.

The principles in accordance with the invention are also applied to make a planar motor having a moving magnet configuration. FIG. 7 is an isometric view illustrating a moving magnet planar motor, in accordance with some embodiments. The entire upper surface of a flat base 112° is covered with coil units 605. Fine stage 11 is suspended above the base 112' of the lower stage 111 and has an array of magnets 607 included in the movable portion 114' of the planar motor and mounted to the fine stage 11 to face the upper surface of the base 112'.

A conventional commutation circuit (not shown) supplies electric current to coil units 605 in accordance with the desired direction of travel of the movable portion 114' and thus the fine stage 11. Appropriately commutated electric current creates Lorentz forces, which propel the fine stage 11 to a desired location, altitude, and attitude.

Following are alternative arrangements of that shown in FIG. 7 which are more fully described and shown in co pending, commonly assigned application Ser. No. 09/135,624, filed Aug. 17, 1998 and entitled "Compact Planar Motor Having Multiple Degrees of Freedom". Application Ser. No. 09/135,624 is hereby incorporated by reference thereto, in its entirety. In some embodiments, to help suspend the fine stage 11 above the base 112 of the lower stage 111, lifting permanent magnets and corresponding hoist permanent magnets are installed respectively on the upper surface of the fine stage 11 and on a stationary frame located above the fine stage 11. Hoist and lifting permanent magnets do not require electric current, and thus reduce or eliminate the electric current needed to generate Z direction forces for suspension of fine stage 11, consequently reducing energy consumption and heat generation. In some embodiments hoist and lifting magnets replace Z force commutation as a means for suspending the fine stage 11 against gravity.

Alternatively, individual horizontally or vertically oriented lifting magnets are paired with iron plates to provide an attractive magnetic force to suspend the fine stage 11 against gravity. In some embodiments hoist and lifting magnets augment air bearings as a means for suspending the fine stage 11 against gravity. In still further embodiments, hoist and lifting magnets augment Z force commutation as a means for suspending fine stage 11 against gravity, permitting motion of fine stage 11 over six degrees of freedom.

Figure 8:
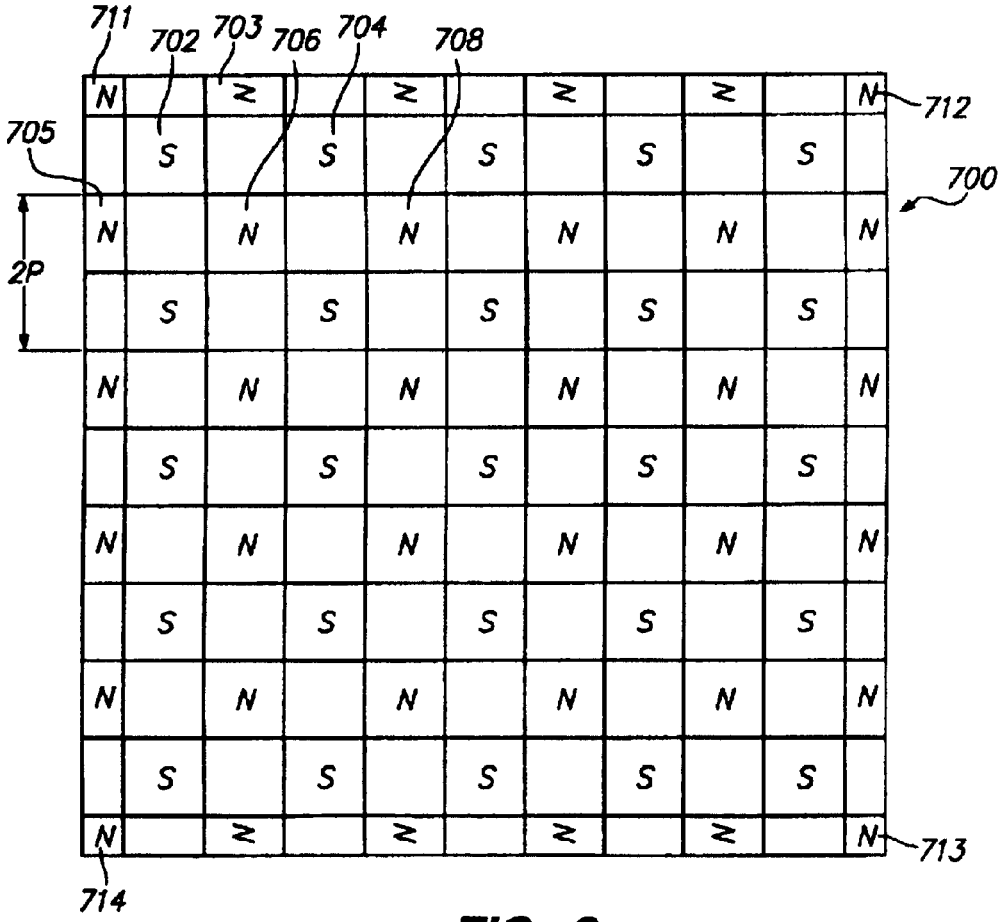
FIG. 8 is a plan view of an example of a magnet array on a stage for a moving magnet planar motor arrangement according to the present invention.

FIG. 8 is a plan view of a magnet array 700 on a movable portion 114' of a planar motor where the magnet array is fixed to a coarse stage 111 for movement thereof. The magnet array 700 is located similarly to the magnet array 607.

Illustratively magnets 702, 704, 706, and 708 in the central portion of array 700 are full sized square magnets. At the four corners of magnet array 700, magnets 711–714 generate substantially one-quarter of the magnetic flux of full sized magnets 702, 704, 706, and 708 and are known as "quarter magnets." The magnets at the outermost row or column other than those at the four corners generate a magnetic flux that is substantially half that of the full sized magnets 702, 704, 706, and 708 and are thus called "half magnets." The full sized S magnets and N magnets (see FIG. 6) are equal in size.

The magnetic pitch of the array is the distance along a particular axis between centers of adjacent full sized S and N magnets. Of importance, half magnets and quarter magnets along the perimeter of moving magnet array 700 optimize the efficiency of the magnet array for providing magnetic flux. For example, full sized S magnet 702 can be considered as four quarter magnet segments. Each quarter magnet segment of S magnet 702 is coupled with an adjacent N quarter magnet segment, namely quarter magnet 711, the closest quarter magnet segment of full sized magnet 706, and the closest quarter magnet segments of half magnets 703 and 705. Similarly across the entire magnet array, every quarter magnet segment of every full sized S magnet is coupled with a nearest neighbor N quarter magnet segment. Without the perimeter of quarter and half magnets, the perimeter would consist of sides of S magnet segments having no coupled nearest neighbor N magnet segments, and therefore not efficiently providing magnetic flux. In some embodiments, the polarities of the respective magnets of magnet array 700 are reversed, such that the perimeter of the array is lined with S polarity half magnets and quarter magnets. Further moving magnet array arrangements are discussed in application Ser. No. 09/135,624, which has been incorporated by reference in its entirety above. Various coil configurations and coil array arrangements for a stationary base are also disclosed in application Ser. No. 09/135,624, all of which are expressly incorporated by reference herein. Still further arrangements for planar motors are disclosed in application Ser. No. 09/192,813, filed on Nov. 16, 1998 and entitled "Electric Motors and Positioning Devices Having Moving Magnet Arrays and Six Degrees of Freedom". Application Ser. No. 09/192,813 is also hereby incorporated by reference thereto in its entirety.

Figure 9:
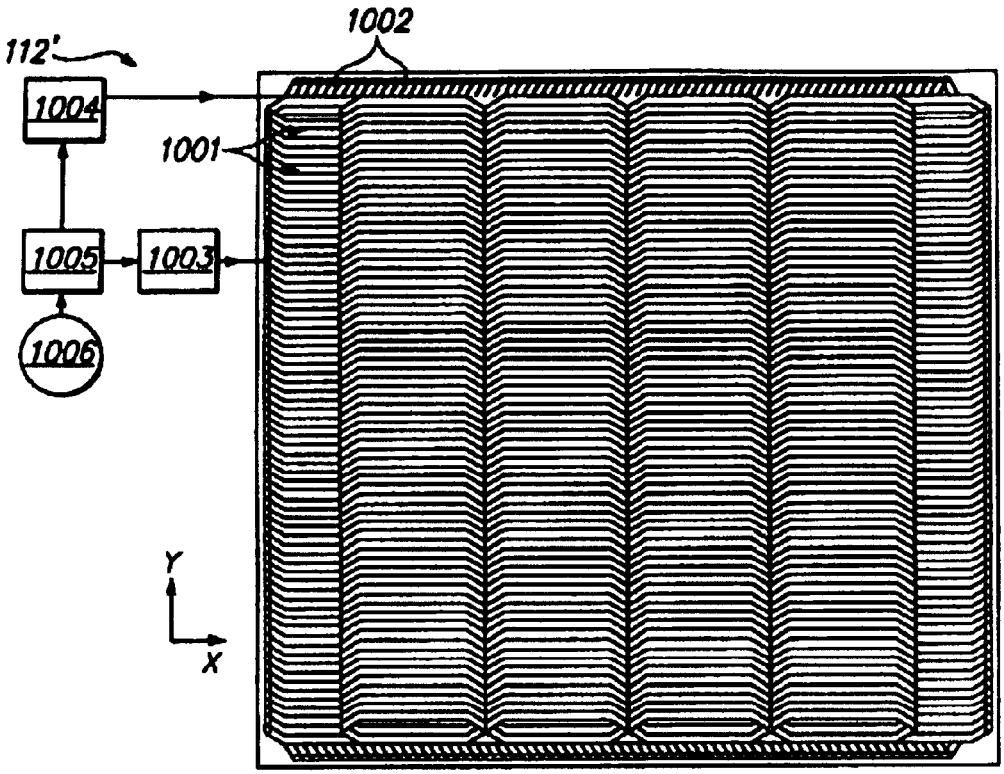
FIG. 9 is a plan view of an example of a coil arrangement in a base of a moving magnet planar motor according to the present invention.

FIG. 9 is a plan view of a base 112' of a moving magnet planar motor, according to the invention. Base 112' includes a plurality of motor coil units configured as shown in FIG. 9, for example, although other configurations may be employed, such as described in application Ser. No. 09/135,624, for example. For a moving magnet planar motor, the coil array must be as long as the required travel of the positioning stage plus the length of the stage (not shown for clarity), and the coil units must cover substantially the entire area of base 112'. In FIG. 9, coil units are arranged into an X-layer for propulsion in the X direction and a Y-layer for propulsion in the Y direction, as denoted by the coordinate arrows. Illustratively, the Y layer is stacked on top of the X layer vertically in the Z direction (perpendicular to X and Y directions). Coil units 1001 are arranged to provide Y direction propulsion, and thus have legs oriented principally perpendicular to the Y direction. Similarly, coil units 1002 (stacked beneath coil units 1001) are arranged to provide X direction propulsion, and thus have legs oriented principally perpendicular to the X direction.

In operation, each coil produces substantially constant force along a respective X or Y linear direction, as shown by arrows in FIG. 9. To generate force in the Y direction, the Y coils 1001 directly underlying the magnet array of the movable portion 114' attached to the fine stage 11 are energized. Similarly, to generate force in the X direction, the X coils 1002 directly underlying the magnet array of the movable portion 114' are energized. To provide rotation parallel to the XY plane, some coil units in either X or Y coils or both X and Y coils are selectively energized in both directions to generate a torque about an axis oriented in the Z direction. To minimize power consumption and heat generation in some embodiments, only the coils underlying the magnet array are selectively energized. Typically these coils are selected by position feedback sensing of the fine stage 11/movable portion 114' coupled through programmable control logic. Illustratively a feedback signal provides an input 1006 to a motor control module 1005, where it is combined with other control signals. Motor control module 1005 in turn controls the operation of commutation circuits and current sources 1003 and 1004, which supply current selectively to Y coils 1001 and X coils 1002 respectively. In some embodiments, separate amplifiers are used for each control coil group. In some embodiments, separate switching logic circuits are used for each control coil group. Although single connecting leads are shown between commutation circuits and current sources 1003, 1004 and their corresponding Y and X coils 1001, 1002, in some embodiments they represent a plurality of electric wires, enabling commutation circuits and current sources 1003, 1004 to energize each individual coil unit of Y and X coils 1001, 1002 selectively.

Figure 11:
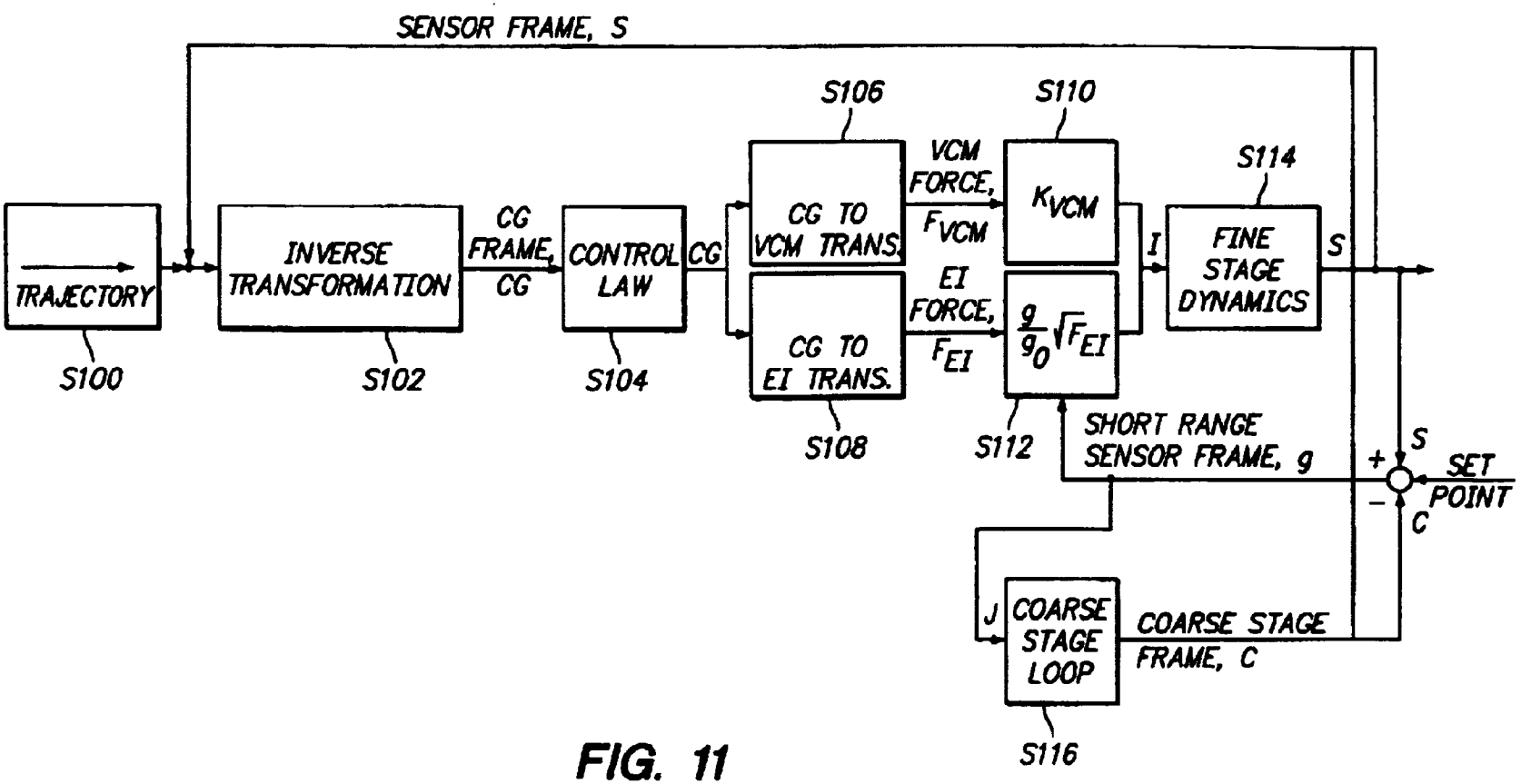
FIG. 11 is a schematic describing the sensing and control functions of the present device.

FIG. 10 shows a lithography system which incorporates a positioner as described above, according to the present invention. The base 112,112' of the lower stage 111 is rigidly attached to the body 1024, along with the interferometers 88 and the lens system 1004. The second column or frame 1032 and the reticle stage 1010 are also attached to the body 1024. The complete body assembly is isolated from the ground by vibration isolators 90. Isolation mounts that are typically used are the "Electro-Damp Active Vibration Control System", available from Newport Corporation of Irvine Calif. The planar position of the fine stage 11, relative to the lens 1004, is measured using interferometers 88 which reflect laser light from interferometer mirrors 4, as alluded to above. The vertical position of the stage is measured using a focus and level sensor (not shown) which reflects light from the wafer surface. FIG. 11 is a schematic which describes the sensing and control functions of the present device. The sensing and control functions are more thoroughly described in co pending application Ser. No. 09/022,713 filed Feb. 12, 1998, Ser. No. 09/139,954 filed Aug. 25, 1998, and Ser. No. 09/141,762, filed Aug. 27, 1998, each of which are hereby incorporated by reference thereto, in their entireties. A trajectory s100, or desired path for the focused optical system to follow is determined based on the desired path of the wafer or other object to which the focused optical system is to be applied. The trajectory s100 is next fed into the control system. The trajectory s100 is compared with a sensor signal vector S which is generated from the output of interferometer 88 and focus and level sensor. The difference vector which results from the comparison is transformed to a CG (center of gravity) coordinate frame through an inverse transformation s102. The control law s104 prescribes the corrective action for the signal. The control law may be in the form of a PID (proportional integral derivative) controller, proportional gain controller or preferably a lead-lag filter, or other commonly known law in the art of control, for example.

The vector for vertical motion is fed to the CG to VCM transformation s106. This transforms the CG signal to a value of force to be generated by the VCMs, which is then fed to the VCM gain s110, and output to the stage hardware s114. The vector for planar motion is fed to the CG to El-core transformation, s108. This transforms the CG signal to a force to be generated by the El-core (i.e., electromagnet and target arrangements 6,8). Because the El-core force depends upon the gap squared, it is compensated by the short range sensor vector g' through the compensation block s112, to produce a linear output to the stage hardware s114. The stage system s114 responds to the input and is measured in the sensor frame S. A similar block is not shown in detail below for the coarse stage loop s116. The coarse frame position C, is computed using the fine stage position S and the gap g. This is servoed to follow the fine stage.

Figure 12:
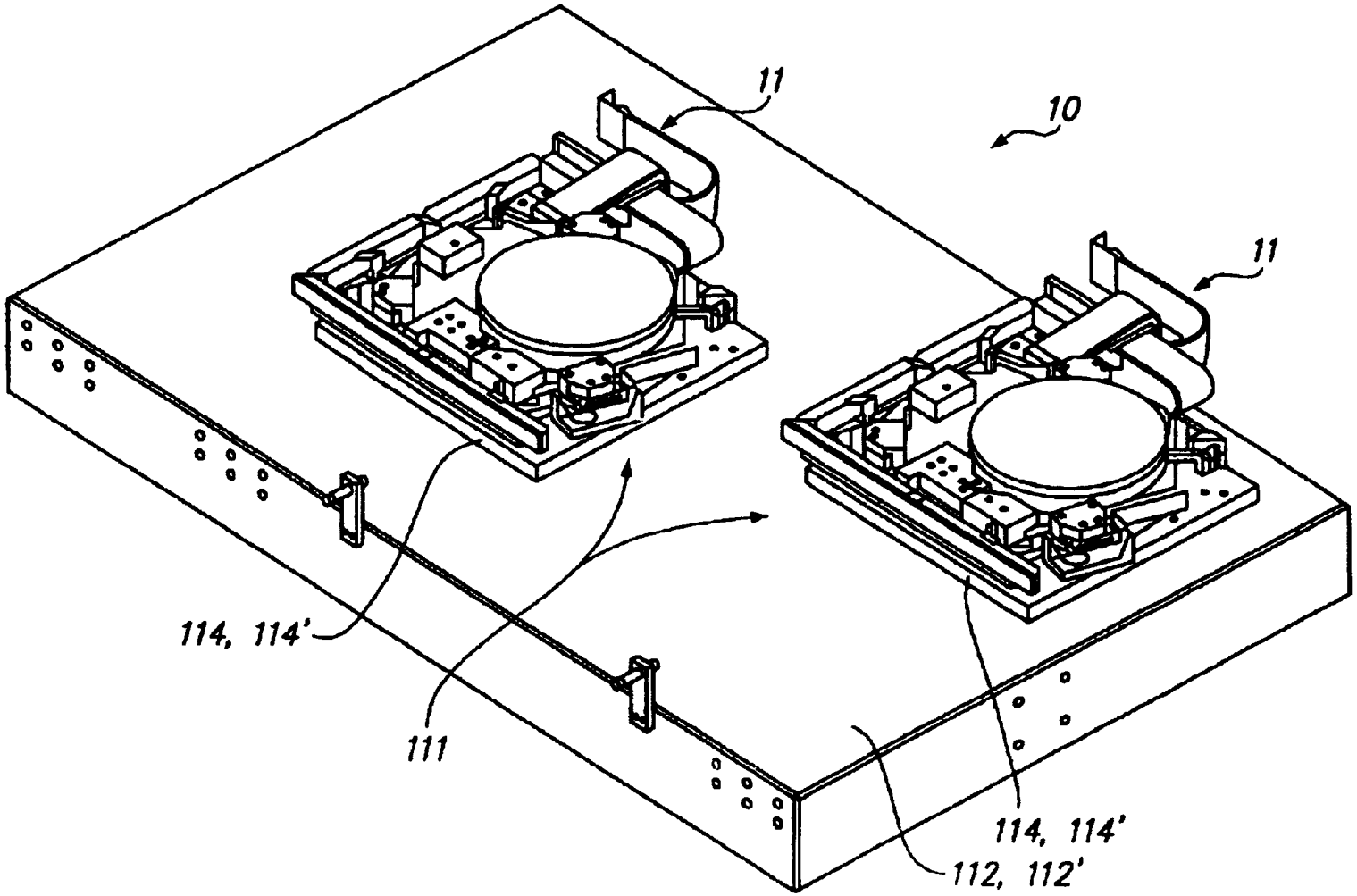
FIG. 12 is a perspective view of a dual stage system according to a preferred embodiment of the present invention.

FIG. 12 is a perspective view of a dual stage system 10 according to another embodiment of the present invention. In this embodiment, two fine stages 11 are positioned on coarse stages 111. The fine stages are independently, coarsely positionable by the lower stages 111 that incorporate a planar motor having a planar base 112,112' upon which translates respective movable portions 114,114' of the planar motor, which in this embodiment, has a movable portion for each fine stage. The fine stages 11 may be configured in any of the ways discussed above with regard to the single fine stage embodiments. Preferably, both fine stages 11 are of the same configuration, which greatly simplifies the interface of both with the single coarse stage 111. However, both fine stages may be mounted to movable coil portions of a linear motor, or movable magnet portions.

The movable coil embodiments are easier from a control aspect, since the fine stages are distinct units and can be controlled that way, against a stationary magnet array 112. Movable magnet configurations are more complicated to control, since the single coil array in the base 112' must be selectively energized to keep the two moving magnet units separated.

Although identical fine stages are preferred, they are not required, and this invention is not to be limited to such. Additionally, there is no reason why more than two fine stages could not be mounted on a single base of a coarse stage.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. For example coil arrays may be aligned in directions non-collinear with orthogonal X and Y axes. Likewise magnets in a magnet array are not necessarily arranged in orthogonal rows and columns. It is to be understood that a photolithographic instrument may differ from the one shown herein without departing from the scope of the invention.

There are a number of different types of lithographic devices. For example, the lithography system 1000 can be used as scanning type photolithography system that exposes the pattern from the reticle onto the wafer with the reticle and wafer moving synchronously. In a scanning type lithographic device, the reticle is moved perpendicular to an optical axis of the lens assembly 1004 by the reticle stage 1010 and the wafer is moved perpendicular to an optical axis of the lens assembly 1004 by the wafer stage assembly 1. Scanning of the reticle and the wafer occurs while the reticle and the wafer are moving synchronously.

Alternately, the lithography system 1000 can be a step-and-repeat type photolithography system the exposes the reticle while the reticle and the wafer are stationary. In the step and repeat process, the wafer is in a constant position relative to the reticle and the lens assembly 1004 during the exposure of an individual field. Subsequently, between consecutive exposure steps, the wafer is consecutively moved by the wafer stage perpendicular to the optical axis of the lens assembly 1004 so that the next field of the wafer is brought into position relative to the lens assembly 1004 and the reticle for exposure. Following this process, the images on the reticle are sequentially exposed onto the fields of the wafer so that the next field of the wafer is brought into position relative to the lens assembly 1004 and the reticle.

However, the use of the lithography system 1000 provided herein is not limited to a photolithography system for semiconductor manufacturing. The lithography system 1000, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 1002 can be g-line (436 nm), i-line (365 nm), KrF excimer laser (248 nm), ArF excimer laser (193 nm) and $F_2$ laser (157 nm).

Alternately, the illumination source 1002 can also use charged particle beams such as an x-ray and electron beam. For instance, in the case where an electron beam is used, thermionic emission type lanthanum hexaboride ($LaB_\alpha$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 1004 included in the photolithography system, the lens assembly 1004 need not be limited to a reduction system. It could also be a 1× or magnification system.

With respect to a lens assembly 1004, when for ultraviolet rays such as the excimer laser is used, glass materials such as quartz and fluorite that transmit far ultra-violet rays is preferable to be used. When the $F_2$ type laser or x-ray is used, the lens assembly 1004 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultraviolet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. No. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 13:
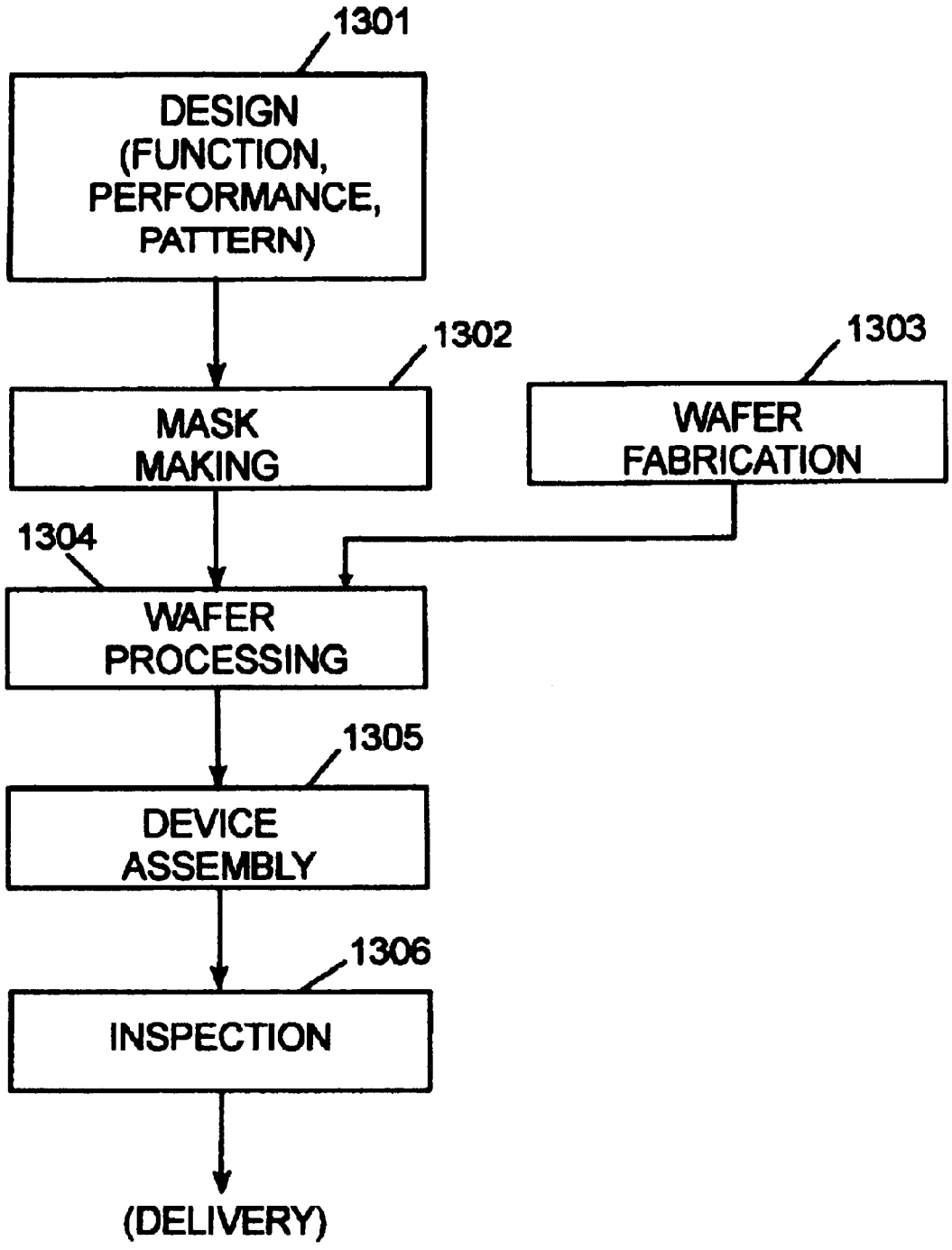
FIG. 13 is a flow chart that outlines a process for manufacturing a device in accordance with the present invention.

Further, semiconductor devices can be fabricated using the above described systems, by the process shown generally in FIG. 13. In step 1301 the device's function and performance characteristics are designed. Next, in step 1302, a mask (reticle) having a pattern is designed according to the previous designing step, and in a parallel step 1303 a wafer is made from a silicon material. The mask pattern designed in step 1302 is exposed onto the wafer from step 1303 in step 1304 by a photolithography system described hereinabove in accordance with the present invention. In step 1305 the semiconductor device is assembled (including the dicing process, bonding process and packaging process), then finally the device is inspected in step 1306.

Figure 14:
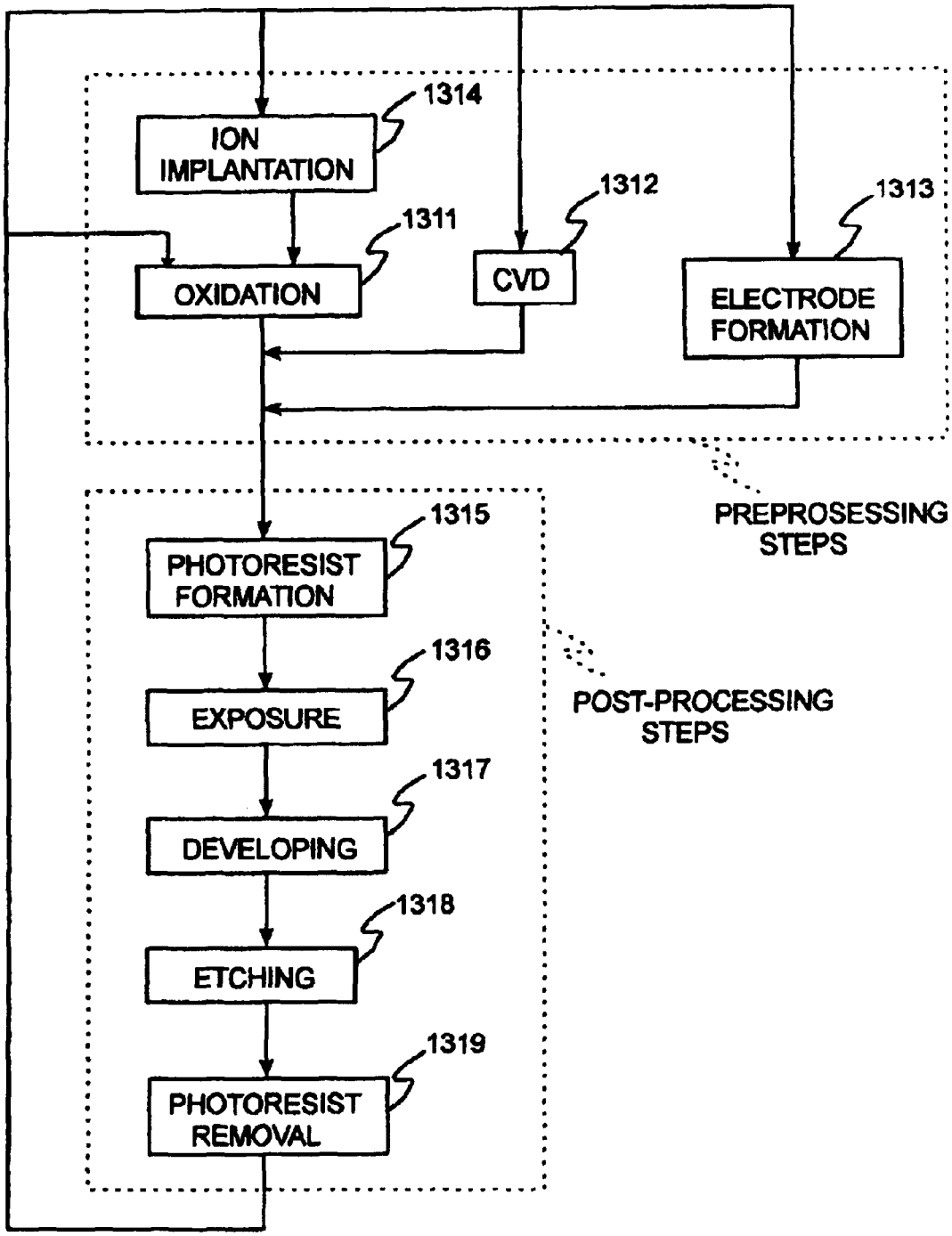
FIG. 14 is a flow chart that outlines device processing in more detail.

FIG. 14 illustrates a detailed flowchart example of the above-mentioned step 1304 in the case of fabricating semiconductor devices. In FIG. 10, in step 1311 (oxidation step), the wafer surface is oxidized. In step 1312 (CVD step), an insulation film is formed on the wafer surface. In step 1313 (electrode formation step), electrodes are formed on the wafer by vapor deposition. In step 1314 (ion implantation step), ions are implanted in the wafer. The above mentioned steps 1311–1314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1315 (photoresist formation step), photoresist is applied to a wafer. Next, in step 1316 (exposure step), the above-mentioned exposure device is used to transfer the circuit pattern of a mask (reticle) to a wafer. Then, in step 1317 (developing step), the exposed wafer is developed, and in step 1318 (etching step), parts other than residual photoresist (exposed material surface) are removed by etching. In step 1319 (photoresist removal step), unnecessary photoresist remaining after etching is removed.

Multiple circuit patterns are formed by repetition of these preprocessing and post-processing steps.

While the particular stage assembly 1 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A positioning stage assembly *for moving a substrate along a trajectory, the positioning stage assembly* comprising:

a coarse stage including a planar motor driveable in at least two degrees of freedom wherein said planar motor comprises a planar magnet array having magnets disposed in a plane and a planar coil array that [is interacting] *interacts* with said planar magnet array to produce a first force and a second force differing from said first force; [and]

a fine stage positioned on said coarse stage and driveable in at least three degrees of freedom with respect to said coarse stage*;*

*a control module that controls movement of said fine stage along said trajectory, wherein said control module controls the movement of said coarse stage to follow said fine stage.*

2. The positioning stage assembly of claim 1, wherein said fine stage is driveable in six degrees of freedom with respect to said coarse stage.

3. The positioning stage assembly of claim 1, further comprising at least one pair of electromagnetic actuators coupling said fine stage to said coarse stage for control in at least one of said degrees of freedom with respect to said coarse stage.

4. The positioning stage assembly of claim 3, wherein both actuators of said pair of electromagnetic actuators are mounted adjacent a single side of said fine stage.

5. The positioning stage assembly of claim 4, wherein both of said actuators of said pair are mounted on said coarse stage in close opposition to one another, and a pair of corresponding targets are mounted on said fine stage adjacent one another and within a predefined gap defined by said mounted electromagnetic actuators.

6. The positioning stage assembly of claim 3, wherein said at least one pair of electromagnetic actuators comprises three pairs of electromagnetic actuators coupling said fine stage to said coarse stage for control in said at least three degrees of freedom with respect to said coarse stage.

7. The positioning stage assembly of claim 6, wherein two of said three pairs of electromagnetic actuators are aligned substantially parallel to a first direction, and a third of said three pairs of electromagnetic actuators is aligned in a second direction substantially perpendicular to said first direction.

8. The positioning stage assembly of claim 7, wherein said first and second directions are within a plane which said fine stage substantially lies in.

9. The positioning stage assembly of claim 5, wherein said pair of corresponding targets are peripherally mounted on said fine stage.

10. The positioning stage assembly of claim 3, wherein said electromagnetic actuators comprise variable reluctance actuators.

11. The positioning stage assembly of claim 3, wherein said at least one pair comprises three pairs of electromagnetic actuators interconnecting said fine stage and said coarse stage and actuable to control said fine stage in three degrees of freedom.

12. The positioning stage assembly of claim 11, further comprising three additional electromagnetic actuators mounted between said fine stage and said coarse stage and actuable to control said fine stage in three additional degrees of freedom.

13. The positioning stage assembly of claim 11, wherein said pairs of electromagnetic actuators comprise variable reluctance actuators.

14. The positioning stage assembly of claim 12, [whrein] *wherein* said additional electromagnetic actuators comprise voice coil motors.

15. The positioning stage assembly of claim 11, wherein said pairs of electromagnetic actuators comprise variable reluctance actuators and said positioning stage further comprises supplemental vertical supports mounted between said fine stage and said coarse stage.

16. The positioning stage assembly of claim 15, wherein said supplemental vertical supports comprise air bellows.

17. The positioning stage assembly of claim 3, further comprising at least one non-contact vertical support member which levitates said fine stage above said coarse stage.

18. The positioning stage assembly of claim 17, wherein said at least one non-contact vertical support member comprises three non-contact vertical support members for controlling the position of said fine stage in three vertical degrees of freedom.

19.. The positioning stage assembly of claim 18, wherein each said non-contact vertical support member comprises an electromagnetic actuator.

20. The positioning stage assembly of claim 18, wherein each said non-contact vertical support member comprises a voice coil motor having a magnet portion and a coil portion, one of said magnet portion and said coil portion being mounted on said fine stage and the other of said magnet portion and said coil portion being mounted on said coarse stage.

21. The positioning stage assembly of claim 18, further comprising at least one dead weight support that supports a dead weight of said fine stage vertically.

22. The positioning stage assembly of claim 18, further comprising at least one air bearing that is coupled to said coarse stage and vertically [supporting] *supports* a dead weight of said coarse stage.

23. The positioning stage assembly of claim 22, wherein said at least one air bearing comprises three air bearings.

24. The positioning stage assembly of claim 9, further comprising at least one target mount extending from a main surface of said fine stage, said pair of corresponding targets [being] mounted on *said* target mount, such that only a resultant force from actuation of said pair of electromagnetic actuators is transferred to said fine stage through said target mount.

25. The positioning stage assembly of claim 1, further comprising a second fine stage driveable in at least three degrees of freedom with respect to said coarse stage and [indepenently] *independently* of the other fine stage.

26. The positioning stage assembly of claim 1, wherein said planar motor is driveable in at least three degrees of freedom.

27. The positioning stage assembly of claim 26, wherein said planar motor is driveable in six degrees of freedom.

28. The positioning stage assembly of claim 1, wherein said magnets of said magnet array have independent magnetic fields and said planar coil array is positioned adjacent to said planar magnet array, with one of said magnet array and said coil array being fixed and the other being movable with respect thereto.

29. The positioning stage assembly of claim 28, wherein said magnet array is fixed and said coil array is movable with respect to said magnet array.

30. The positioning stage assembly of claim 28, wherein said coil array is fixed and said magnet array is movable with respect to said coil array.

[31. A lithography system comprising:

an illumination system that irradiates radiant energy;

a coarse stage that includes a planar motor driveable in at least two degrees of freedom with respect to said radiant energy wherein said planar motor comprises a planar magnet array having magnets disposed in a plane and a planar coil array that is interacting with said planar magnet array to produce a first force and a second force differing from said first force; and a fine stage positioned on said coarse stage and driveable in at least three degrees of freedom with respect to said coarse stage.]

[32. The lithography system of claim 31, wherein said fine stage is driveable in six degrees of freedom with respect to said coarse stage.]

[33. The lithography system of claim 31, further comprising at least one pair of electromagnetic actuators coupling said fine stage to said coarse stage for control in at least one of said degrees of freedom with respect to said coarse stage.]

[34. The lithography system of claim 33, wherein both actuators of said pair of electromagnetic actuators are mounted adjacent a single side of said fine stage.]

[35. The lithography system of claim 34, wherein both of said actuators of said pair are mounted on said coarse stage in close opposition to one another, and a pair of corresponding targets are mounted on said fine stage adjacent one another and within a predefined gap defined by said mounted electromagnetic actuators.]

[36. The lithography system of claim 31, further comprising a mask pattern positioned between said illumination system and said fine stage.]

[37. The lithography system of claim 36, further comprising a lens system positioned between said mask pattern and said fine stage.]

[38. The lithography system of claim 33, wherein said at least one pair of electromagnetic actuators comprises three pairs of electromagnetic actuators coupling said fine stage to said coarse stage for control in said at least three degrees of freedom with respect to said coarse stage.]

[39. The positioning stage assembly of claim 38, wherein two of said three pairs of electromagnetic actuators are aligned substantially parallel to a first direction, and a third of said three pairs of electromagnetic actuators is aligned in a second direction substantially perpendicular to said first direction.]

[40. The lithography system of claim 39, wherein said first and second directions are within a plane which said fine stage substantially lies in.]

[41. The lithography system of claim 35, wherein said pair of corresponding targets are peripherally mounted on said fine stage.]

[42. The lithography system of claim 33, wherein said electromagnetic actuators comprise variable reluctance actuators.]

[43. The lithography system of claim 33, wherein said at least one pair comprises three pairs of electromagnetic actuators interconnecting said fine stage and said coarse stage and actuable to control said fine stage in three degrees of freedom.]

[44. The lithography system of claim 43, further comprising three additional electromagnetic actuators mounted between said fine stage and said coarse stage and actuable to control said fine stage in three additional degrees of freedom.]

[45. The lithography system of claim 43, wherein said pairs of electromagnetic actuators comprise variable reluctance actuators.]

[46. The lithography system of claim 44, wherein said additional electromagnetic actuators comprise voice coil motors.]

[47. The lithography system of claim 43, wherein said pairs of electromagnetic actuators comprise variable reluctance actuators, said lithography system further comprising supplemental vertical supports mounted between said fine stage and said coarse stage.]

[48. The lithography system of claim 47, wherein said supplemental vertical supports comprise air bellows.]

[49. The lithography system of claim 33, further comprising at least one non-contact vertical support member which levitates said fine stage above said coarse stage.]

[50. The lithography system of claim 49, wherein said at least one non-contact vertical support member comprises three non-contact vertical support members for controlling the position of said fine stage in three vertical degrees of freedom.]

[51. The lithography system of claim 50, wherein each said non-contact vertical support member comprises an electromagnetic actuator.]

[52. The lithography system of claim 50, wherein each said non-contact vertical support member comprises a voice coil motor having a magnet portion and a coil portion, one of said magnet portion and said coil portion being mounted on said fine stage and the other of said magnet portion and said coil portion being mounted on said coarse stage.]

[53. The lithography system of claim 50, further comprising at least one dead weight support that supports a dead weight of said fine stage vertically.]

[54. The lithography system of claim 50, further comprising at least one air bearing that is coupled to said coarse stage and vertically supporting a dead weight of said coarse stage.]

[55. The lithography system of claim 54, wherein said at least one air bearing comprises three air bearings.]

[56. The lithography system of claim 31, further comprising a second fine stage driveable in at least three degrees of freedom with respect to said coarse stage and independently of the other fine stage.]

[57. The lithography system of claim 31, wherein said planar motor is driveable in six degrees of freedom.]

[58. A device manufactured with the lithography system of claim 31.]

[59. A wafer on which an image has been formed by the lithography system of claim 31.]

60. A method of precisely positioning a stage, comprising:

coarse positioning the stage in at least two degrees of freedom, wherein said coarse positioning is driven by a planar motor, said planar motor comprising a planar magnet array having magnets disposed in a plane and a planar coil array that [is interacting] *interacts* with said planar magnet array to produce a first force and a second force differing from said first force; and fine positioning the stage in at least three degrees of freedom with respect to said coarse positioning *by inputting opposing forces for moving the stage in opposite directions at the same location on the stage, such that a pulling force for moving the stage in a first direction is inputted at the same side of the stage as a pulling force for moving the stage in a second direction opposite to the first direction, whereby the greater pulling force determines a resultant direction of movement.*

61. The method of claim 60, wherein said coarse positioning comprises positioning in at least three degrees of freedom.

62. The method of claim 61, wherein said coarse positioning comprises positioning in six degrees of freedom.

63. The method of claim 60, wherein said fine positioning comprises positioning in six degree of freedom with respect to said coarse positioning.

[64. The method of claim 60, wherein said fine positioning comprises inputting opposing forces for moving the stage in opposite directions at the same location on the stage, such that a pulling force for moving the stage in a first direction is inputted at the same side of the stage as a pulling force for moving the stage in a second direction opposite to the first direction, whereby the greater pulling force determines a resultant direction of movement.]

65. The method of claim [64 *60,* wherein said inputting comprises inputting magnetic driving forces with no physical contact of the stage by a driver.

66. [The method of claim 60,] *A method of precisely positioning a stage, comprising:*

*coarse positioning the stage in at least two degrees of freedom, wherein said coarse positioning is driven by a planar motor, said planar motor comprising a planar magnet array having magnets disposed in a plane and a planar coil array that interacts with said planar magnet array to produce a first force and a second force differing from said first force; and*

[wherein said fine positioning comprises] *fine positioning the stage in at least three degrees of freedom with respect to said coarse positioning by* controlling movements in at least three degrees of freedom of said stage by arranging three input locations on the stage, such that a pulling force for moving the stage in a first direction at each location is inputted at the same side of the stage as a pulling force for moving the stage in a second direction opposite to the first direction.

67. The method of claim 60, further comprising floating said stage with respect to a coarse stage base such that positioning movements of the stage are performed with no physical contact occurring between the stage and the coarse stage base.

68. The method of claim 67, wherein said floating comprises electromagnetically biasing the stage with respect to the coarse stage base.

69. The method of claim 60, wherein said fine positioning comprises actuating controlling movements in at least three degrees of freedom with variable reluctance actuators.

70. The method of claim 69, further comprising fine controlling the stage in three additional degrees of freedom with voice coil motors.

71. A method for operating a lithography system comprising the method of precisely positioning a stage according to claim 60.

72. A method for making an object including at least the photolithography process, wherein the photolithography process utilizes the method for operating a lithography system of claim 71.

73. A method for making a wafer utilizing the method for operating a lithography system of 71.

74. A method of precisely positioning *a substrate along a trajectory*, comprising:

coarse positioning two stages independently of one another, each in at least two degrees of freedom, wherein said coarse positioning is driven by a planar motor; [and]

fine positioning the two stages independently of one another, each in at least three degrees of freedom with respect to said coarse positioning;

*controlling said fine positioning along said trajectory with a control module; and*

*controlling said coarse positioning with said control module to follow said fine positioning.*

75. The method of claim 74, wherein said coarse positioning comprises positioning in at least three degrees of freedom.

76. The method of claim 75, wherein said coarse positioning comprises positioning in six degrees of freedom.

77. The method of claim 74, wherein said fine positioning comprises positioning in six degrees of freedom with respect to said coarse positioning.

78. A method for operating a lithography system comprising the method of precisely positioning of claim 74.

79. A method for making an object including at least the photolithography process, wherein the photolithography process utilizes the method for operating a lithography system of claim 78.

80. A method for making a wafer utilizing the method for operating a lithography system of claim 78.

[81. A positioning stage assembly comprising:

a coarse stage including a planar motor driveable in at least two degrees of freedom; and a fine stage positioned on said coarse stage and driveable in six degrees of freedom with respect to said coarse stage.]

[82. A positioning stage assembly comprising:

a coarse stage including a planar motor driveable in at least two degrees of freedom;

a fine stage positioned on said coarse stage and driveable in at least three degrees of freedom with respect to said coarse stage;

at least one pair of electromagnetic actuators coupling said fine stage to said coarse stage for control in at least one of said degrees of freedom with respect to said coarse stage; and at least one non-contact vertical support member which levitates said fine stage above said coarse stage.]

[83. A positioning stage assembly comprising:

a coarse stage including a planar motor driveable in at least two degrees of freedom;

a fine stage positioned on said coarse stage and driveable in at least three degrees of freedom with respect to said coarse stage; and a second fine stage positioned on said coarse stage and driveable in at least three degrees of freedom with respect to said coarse stage and independently of the other fine stage.]

84. A positioning stage assembly *form moving a substrate along a trajectory, the positioning stage assembly* comprising:

a coarse stage including a planar motor driveable in six degrees of freedom; [and]

a fine stage positioned on said coarse stage and driveable in at least three degrees of freedom with respect to said coarse stage*; and*

*a control module that controls movement of said fine stage along said trajectory, wherein said control module controls the movement of said coarse stage to follow said fine stage.*

85. A lithography system comprising:

an illumination system that irradiates radiant energy;

a coarse stage that includes a planar motor driveable in at least two degrees of freedom with respect to said radiant energy; [and]

a fine stage positioned on said coarse stage and driveable in six degrees of freedom with respect to said coarse stage*; and*

*a control module that controls movement of said fine stage along a trajectory, wherein said control module controls the movement of said coarse stage to follow said fine stage.*

[86. A lithography system comprising:

an illumination system that irradiates radiant energy;

a coarse stage that includes a planar motor driveable in at least two degrees of freedom with respect to said radiant energy;

a fine stage positioned on said coarse stage and driveable in at least three degrees of freedom with respect to said coarse stage;

at least one pair of electromagnetic actuators coupling said fine stage to said coarse stage for control in at least one of said degrees of freedom with respect to said course stage; and at least one non-contact vertical support member which levitates said fine stage above said coarse stage.]

[87. A lithography system comprising:

an illumination system that irradiates radiant energy;

a coarse stage that includes a planar motor driveable in at least two degrees of freedom with respect to said radiant energy;

a fine stage positioned on said coarse stage and driveable in at least three degrees of freedom with respect to said coarse stage; and a second fine stage positioned on said coarse stage and driveable in at least three degrees of freedom with respect to said coarse stage and independently of the other fine stage.]

[88. A lithography system comprising:

an illumination system that irradiates radiant energy;

a coarse stage that includes a planar motor driveable in six degrees of freedom with respect to said radiant energy; and a fine stage positioned on said coarse stage and driveable in at least three degrees of freedom with respect to said coarse stage.]

[89. A method of precisely positioning a stage, comprising:

coarse positioning the stage in at least two degrees of freedom, wherein said coarse positioning is driven by a planar motor; and fine positioning the stage in six degrees of freedom with respect to said coarse positioning.]

*90. A positioning stage assembly for moving a substrate along a trajectory, the positioning stage assembly comprising:*

*a moving device including a planar motor driveable in at least two degrees of freedom wherein said planar motor comprises a planar magnet array having magnets disposed in a plane and a planar coil array that interacts with said planar magnet array to produce a first force and a second force differing from said first force;*

*a stage positioned on said moving device and driveable in at least one degree of freedom in common with said at least two degrees of freedom in which said planar motor is driveable, with respect to said moving device; and*

*a control module that controls movement of said stage to follow said trajectory, wherein said control module controls the movement of said moving device to follow said stage.*

*91. The positioning stage assembly of claim 90, wherein said stage is driveable in three degrees of freedom with respect to said moving device.*

*92. The positioning stage assembly of claim 90, wherein said stage is driveable in six degrees of freedom with respect to said moving device.*

*93. The positioning stage assembly of claim 90, further comprising a second stage driveable in at least one degree of freedom with respect to said moving device and independently of the other stage.*

*94. A lithography system comprising:*

*illuminating means for irradiating radiant energy;*

*driving means for driving a moving member, said driving means including a planar motor driveable at least along an X-axis and along a Y-axis with respect to said radiant energy wherein said planar motor comprises a planar member having magnetic means for generating magnetic flux and disposed in a plane, and a planar coil array that interacts with said magnetic means to produce a first force and a second force differing from said first force;*

*actuating means for actuating a stage, said actuating means positioned on said moving member and driveable at least along one of said X-axis and said Y-axis with respect to said moving member;*

*controlling means for controlling said actuating means to follow a trajectory, wherein said controlling means controls said driving means to follow said actuating means.*

*95. A lithography system comprising:*

*an illumination system that irradiates radiant energy;*

*a positioning system that comprises a planar motor including a first member and a plurality of second members that interact with said first member to produce a driving force, wherein each of said plurality of second members is movable in at least two degrees of freedom with respect to said first member and said radiant energy, and independently of the other second members; wherein each of said plurality of second members has a stage mounted thereon, each said stage movable in at least one degree of freedom with respect to said second member that each said stage is mounted on; and*

*a control system that controls movement of each said stage to follow a trajectory, said control system controlling movement of each said second member to follow the movement of each said stage.*

*96. The lithography system of claim 95, wherein said stage is movable in at least three degrees of freedom with respect to said second member that each said stage is mounted on.*

*97. A process for manufacturing a device including the steps of providing a substrate and transferring an image onto the substrate with the lithography system of claim 95.*

*98. A process for manufacturing a wafer including the steps of providing a substrate and transferring an image onto the substrate with the lithography system of claim 95.*

* * * * *

UNITED STATES PATENT AND TRADEMARK OFFICE

CERTIFICATE OF CORRECTION

PATENT NO. : Re 41,232 E
APPLICATION NO. : 10/876201
DATED : April 20, 2010
INVENTOR(S) : Andrew J. Hazelton et al.

It is certified that error appears in the above-identified patent and that said Letters Patent is hereby corrected as shown below:

In the Claims:

Claim 1, column 18, line 35, after "stage;" please insert -- and --

Claim 65, column 22, line 19, after "[64" please insert -- ] --

Claim 73, column 22, line 61, after "of" please insert -- claim --

Claim 84, column 23, line 51, please delete "form" and insert -- for --

Signed and Sealed this

Twenty-third Day of November, 2010

David J. Kappos

David J. Kappos
*Director of the United States Patent and Trademark Office*